(12) United States Patent
Gomez et al.

(10) Patent No.: US 9,614,575 B2
(45) Date of Patent: Apr. 4, 2017

(54) DIRECT COUPLED RADIO FREQUENCY (RF) TRANSCEIVER FRONT END

(75) Inventors: Ramon Gomez, San Juan Capistrano, CA (US); Giuseppe Cusmai, Irvine, CA (US); Jianhong Xiao, Irvine, CA (US); Takayuki Hayashi, Lake Forest, CA (US); Young Shin, Irvine, CA (US)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 663 days.

(21) Appl. No.: 12/385,915

(22) Filed: Apr. 23, 2009

(65) Prior Publication Data
US 2010/0197244 A1 Aug. 5, 2010

Related U.S. Application Data

(60) Provisional application No. 61/202,144, filed on Jan. 30, 2009.

(51) Int. Cl.
*H04B 1/58* (2006.01)
*H03F 1/02* (2006.01)
(Continued)

(52) U.S. Cl.
CPC ............ *H04B 1/58* (2013.01); *H03F 1/0277* (2013.01); *H03F 3/195* (2013.01); *H03F 3/211* (2013.01); *H03F 3/245* (2013.01); *H03F 3/4508* (2013.01); *H03F 3/45085* (2013.01); *H03F 3/45475* (2013.01); *H03F 3/72* (2013.01); *H03F 2200/09* (2013.01); *H03F 2200/222* (2013.01); *H03F 2200/27* (2013.01); *H03F 2200/387* (2013.01); *H03F 2200/411* (2013.01);
(Continued)

(58) Field of Classification Search
CPC ......... H04B 1/58; H03F 1/0277; H03F 3/195; H03F 3/211; H03F 3/245; H03F 3/4508; H03F 3/45085; H03F 3/45475; H03F 3/72
USPC .... 455/73, 78, 80, 84, 88; 327/52, 560–563; 330/129, 130, 252, 261, 296
See application file for complete search history.

(56) References Cited

U.S. PATENT DOCUMENTS 6,009,314 A * 12/1999 Bjork et al. .................... 455/83
6,472,908 B1 * 10/2002 Smetana ........................ 327/52
(Continued)

*Primary Examiner* — Lincoln Donovan
*Assistant Examiner* — Colleen O Toole
(74) *Attorney, Agent, or Firm* — Sterne, Kessler, Goldstein & Fox P.L.L.C.

(57) ABSTRACT

A method and apparatus is disclosed to couple a transmission amplifier and a reception amplifier to a shared medium. An output of the transmission amplifier is directly coupled to an input of the reception amplifier to form a common connection. The transmission amplifier and the reception amplifier may receive a first amplifier bias via the common connection. In response to the first amplifier bias, the transmission amplifier provides a first communication signal to the shared medium and the reception amplifier does not provide a second communication signal from the shared medium. Alternatively, the transmission amplifier and the reception may receive a second amplifier bias via the common connection. In response to the second amplifier bias, the reception amplifier provides the second communication signal from the shared medium and the transmission amplifier does not provide the first communication signal to the shared medium.

24 Claims, 19 Drawing Sheets

(51) Int. Cl.
  *H03F 3/195* (2006.01)
  *H03F 3/21* (2006.01)
  *H03F 3/24* (2006.01)
  *H03F 3/45* (2006.01)
  *H03F 3/72* (2006.01)

(52) U.S. Cl.
  CPC .. *H03F 2200/423* (2013.01); *H03F 2200/451* (2013.01); *H03F 2200/541* (2013.01); *H03F 2203/21106* (2013.01); *H03F 2203/21142* (2013.01); *H03F 2203/21191* (2013.01); *H03F 2203/21196* (2013.01); *H03F 2203/45136* (2013.01); *H03F 2203/45138* (2013.01); *H03F 2203/45352* (2013.01); *H03F 2203/45702* (2013.01); *H03F 2203/7203* (2013.01); *H03F 2203/7206* (2013.01); *H03F 2203/7236* (2013.01)

(56) References Cited

U.S. PATENT DOCUMENTS

| | | | |
|---|---|---|---|
| 6,735,418 B1 * | 5/2004 | MacNally et al. | 455/78 |
| 6,798,294 B2 * | 9/2004 | Kuiri | 330/295 |
| 6,980,776 B2 * | 12/2005 | Shimada et al. | 455/83 |
| 7,324,791 B2 * | 1/2008 | Nakatani | H03F 1/3211 455/323 |
| 7,756,486 B1 * | 7/2010 | Tan et al. | 455/73 |
| 8,099,062 B1 * | 1/2012 | Terrovitis | 455/84 |
| 2005/0258896 A1 * | 11/2005 | Bardsley et al. | 330/51 |
| 2006/0284670 A1 * | 12/2006 | Eid et al. | 327/563 |

* cited by examiner

DIRECT COUPLED RADIO FREQUENCY (RF) TRANSCEIVER FRONT END

CROSS-REFERENCE TO RELATED APPLICATIONS

The present application claims the benefit of U.S. Provisional Patent Appl. No. 61/202,144, filed Jan. 30, 2009, entitled "Direct Coupled Radio Frequency (RF) Transceiver Front End," which is incorporated herein by reference in its entirety.

FIELD OF THE INVENTION

The present invention relates generally to a communications transceiver and specifically to a front end of the communication transceiver to interface a shared medium.

BACKGROUND

A communication transceiver allows a two-way, or bidirectional, communication through a shared medium, such as a microwave radio link, a satellite channel, a fiber optic cable, a hybrid fiber optic cable system, or a copper cable to provide some examples. The communication transceiver may include a transmission amplifier, such as a power amplifier (PA), with enough drive capability to generate strong transmitter waveforms and a reception amplifier, such as a low noise amplifier (LNA), with suitable fidelity to boost weak received signals. The transmission amplifier and the reception amplifier are often impedance-matched to the shared medium, especially at higher frequencies, requiring a mechanism to couple the transmission amplifier and the reception amplifier to the shared medium.

These mechanisms often depend on characteristics of the shared medium and the design of the communication system. Frequency diplexers and circulators are some common techniques used at radio frequencies (RF). Frequency diplexers are not appropriate for connecting the transmission amplifier and the reception amplifier to the shared medium when a common frequency band is shared for transmit and receive functions. Likewise, circulators are large in size and may become too costly at RF. Another common technique used at RF are transmit/receive switches. In this technique, the transmission amplifier and the reception amplifier are coupled to the shared medium via one or more transmit/receive switches. The transmit/receive switches coupled either the transmission amplifier or the reception amplifier to the shared medium.

A transmit/receive switch with adequate performance may be difficult to integrate into an RF integrated circuit (IC). For example, high-speed Field Effect Transistors (FETs) switches may not be available in a pure bipolar process. If the switch is available, it may not have adequate frequency response or too much loss. The high voltage swings of the transmission amplifier may force some components of an integrated transmit/receive switch design to exceed the maximum voltage limits of the IC process. As a result, the transmit/receive switches often remain an external component, often with an increased cost, to the IC for this reason.

Thus, there is a need for an apparatus and/or a method to couple the transmission amplifier and the reception amplifier to the shared medium that overcomes the shortcomings described above. Further aspects and advantages of the present invention will become apparent from the detailed description that follows.

BRIEF DESCRIPTION OF THE DRAWINGS/FIGURES

The present invention is described with reference to the accompanying drawings. In the drawings, like reference numbers indicate identical or functionally similar elements. Additionally, the left most digit(s) of a reference number identifies the drawing in which the reference number first appears.

Figure 1:
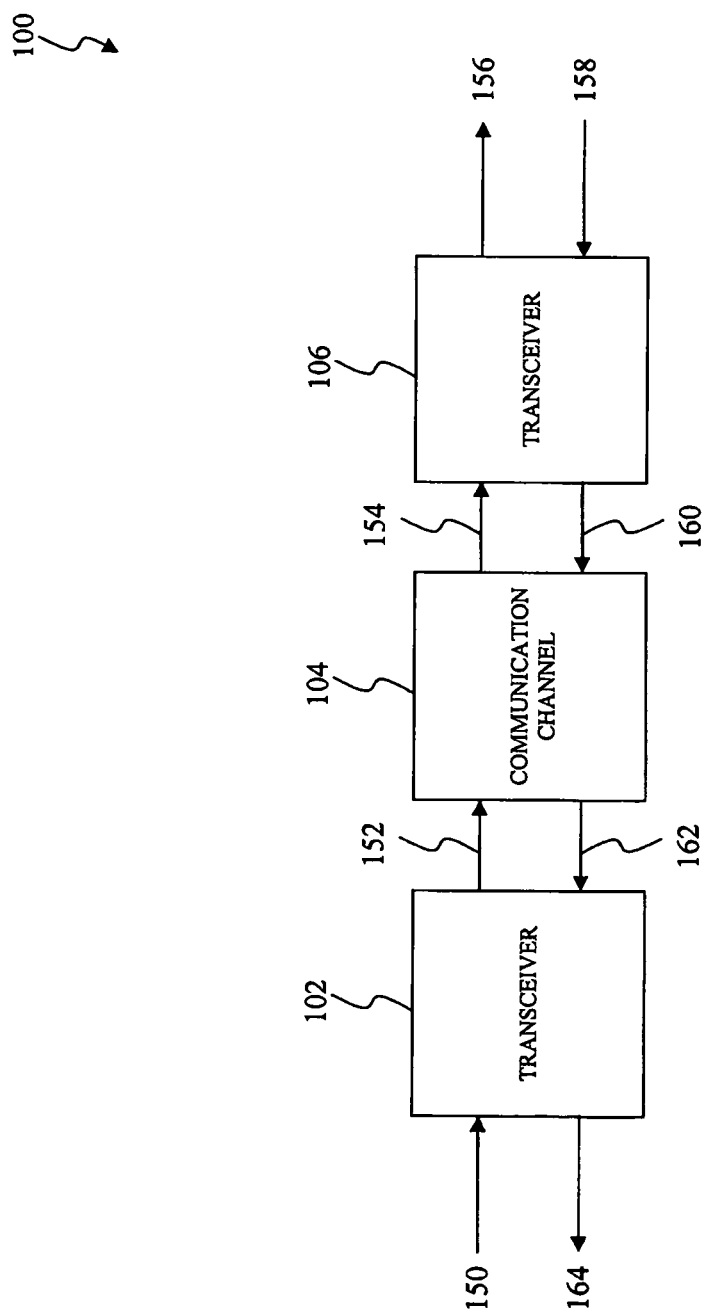
FIG. 1 illustrates a block diagram of a communications environment according to an exemplary embodiment of the present invention.

The present invention will now be described with reference to the accompanying drawings. In the drawings, like reference numbers generally indicate identical, functionally similar, and/or structurally similar elements. The drawing in which an element first appears is indicated by the leftmost digit(s) in the reference number.

DETAILED DESCRIPTION OF THE INVENTION

The following Detailed Description refers to accompanying drawings to illustrate exemplary embodiments consistent with the invention. References in the Detailed Description to "one exemplary embodiment," "an exemplary embodiment," "an example exemplary embodiment," etc., indicate that the exemplary embodiment described may include a particular feature, structure, or characteristic, but every exemplary embodiment may not necessarily include the particular feature, structure, or characteristic. Moreover, such phrases are not necessarily referring to the same exemplary embodiment. Further, when a particular feature, structure, or characteristic is described in connection with an exemplary embodiment, it is within the knowledge of those skilled in the relevant art(s) to effect such feature, structure, or characteristic in connection with other exemplary embodiments whether or not explicitly described.

The exemplary embodiments described herein are provided for illustrative purposes, and are not limiting. Other exemplary embodiments are possible, and modifications may be made to the exemplary embodiments within the spirit and scope of the invention. Therefore, the Detailed Description is not meant to limit the invention. Rather, the scope of the invention is defined only in accordance with the following claims and their equivalents.

The following Detailed Description of the exemplary embodiments will so fully reveal the general nature of the invention that others can, by applying knowledge of those skilled in relevant art(s), readily modify and/or adapt for various applications such exemplary embodiments, without undue experimentation, without departing from the spirit and scope of the present invention. Therefore, such adaptations and modifications are intended to be within the meaning and plurality of equivalents of the exemplary embodiments based upon the teaching and guidance presented herein. It is to be understood that the phraseology or terminology herein is for the purpose of description and not of limitation, such that the terminology or phraseology of the present specification is to be interpreted by those skilled in relevant art(s) in light of the teachings herein.

Communications Environment

FIG. 1 illustrates a block diagram of a communications environment according to an exemplary embodiment of the present invention. The communications environment 100 includes a first communications transceiver 102 to transmit one or more first information signals, denoted as a first information signal 150, as received from one or more first transceiver user devices to a second communications transceiver 106 via a communications channel 104. The one or more first transceiver user devices may include, but are not limited to, personal computers, data terminal equipment, telephony devices, broadband media players, personal digital assistants, software applications, or any other device capable of transmitting or receiving data. The first communications transceiver 102 provides a first transmitted communications signal 152 based upon the first information signal 150.

The first transmitted communications signal 152 passes through the communications channel 104 to provide a first received communications signal 154. The communications channel 104 may include, but is not limited to, a microwave radio link, a satellite channel, a fiber optic cable, a hybrid fiber optic cable system, or a copper cable to provide some examples.

The second communications transceiver 106 receives the first received communications signal 154 as it passes through the communications channel 104 to provide one or more first recovered information signals, denoted as a first recovered information signal 156, for one or more second transceiver user devices. The one or more second transceiver user devices may include, but are not limited to, personal computers, data terminal equipment, telephony devices, broadband media players, personal digital assistants, software applications, or any other device capable of transmitting or receiving data.

The second communications transceiver 106 transmits one or more second information signals, denoted as a second information signal 158, as received from the one or more second transceiver user devices to the first communications transceiver 102 via the communications channel 104. The second communications transceiver 106 provides a second transmitted communications signal 160 based upon the second information signal 158.

The second transmitted communications signal 160 passes through the communications channel 104 to provide a second received communications signal 162. The first communications transceiver 102 receives the second received communications signal 162 as it passes through the communications channel 104 to provide one or more second recovered information signals, denoted as a second recovered information signal 164, for the one or more first transceiver user devices.

Communications Transceiver

Figure 2:
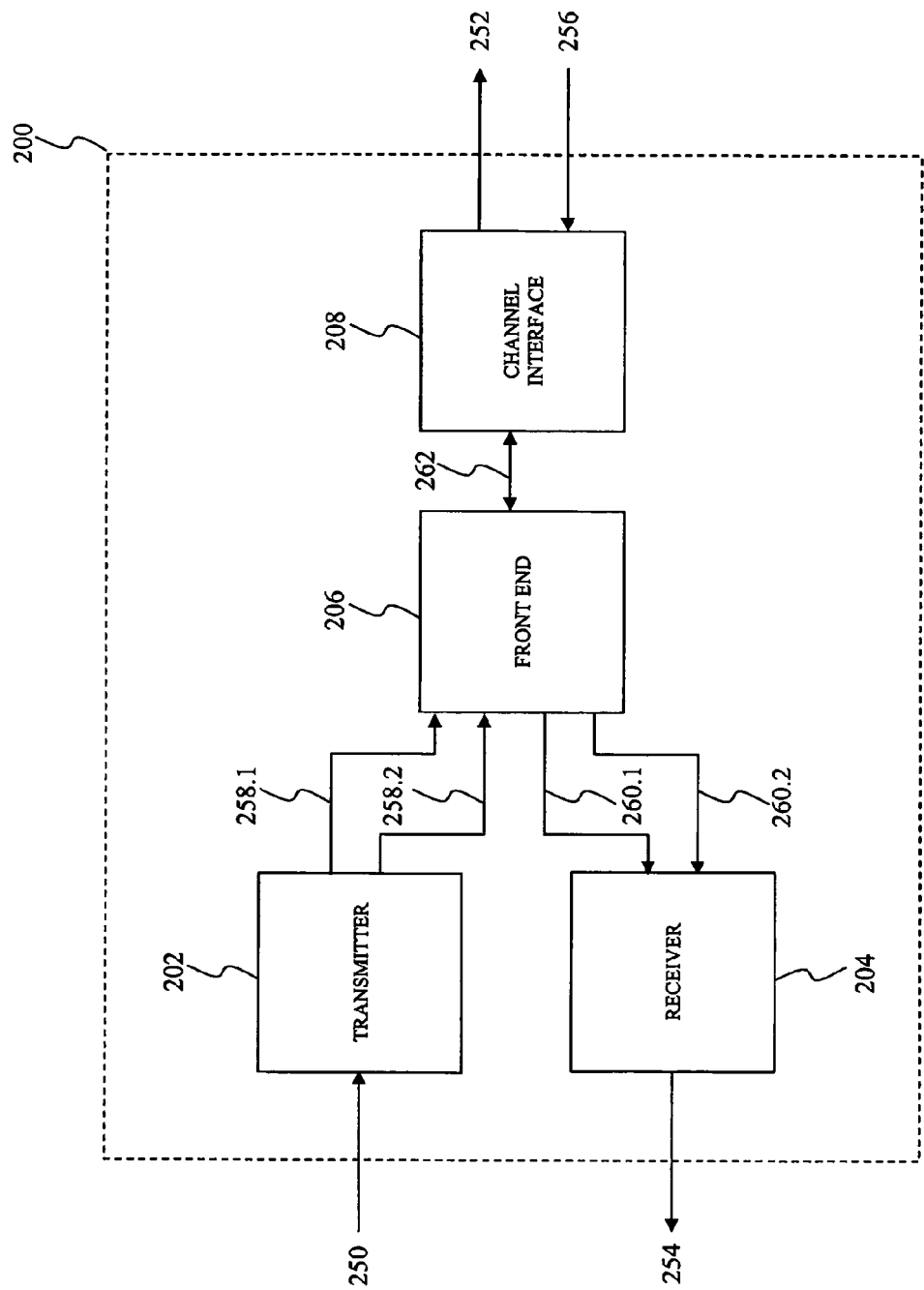
FIG. 2 illustrates a block diagram of a communications transceiver used in the communications environment according to an exemplary embodiment of the present invention.

FIG. 2 illustrates a block diagram of a communications transceiver used in the communications environment according to an exemplary embodiment of the present invention. A communications transceiver 200 provides a transmitted communications signal 252 based upon an information signal 250 and/or a recovered information signal 254 based upon a received communications signal 256. The communications transceiver 200 may represent an exemplary embodiment of the first communications transceiver 102 and/or the second communications transceiver 106 as described above.

The communications transceiver 200 includes a transmitter module 202, a receiver module 204, a front end module 206, and a channel interface module 208. The transmitter module 202 provides an unamplified transmitted communications signal 258 based upon the information signal 250. The unamplified transmitted communications signal 258 may represent a differential communications signal including a first unamplified transmitted communications signal 258.1 and a second unamplified transmitted communications signal 258.2. However, those skilled in the relevant art(s) may implement the communications transceiver 200 using a single component of the unamplified transmitted communications signal 258 differently in accordance with the teachings herein without departing from the spirit and scope of the present invention. The functionality of the transmitter module 202 may include filtering of, encoding of, modulating of, and/or error correction of the information signal 250. However these examples are not limiting, those skilled in the relevant art(s) may implement the transmitter module 202 to include any other suitable function(s) without departing from the spirit and scope of the present invention.

The receiver module 204 provides recovered information signal 254 based upon an amplified received communications signal 260. The amplified received communications signal 260 may represent a differential communications signal including a first amplified received communications signal 260.1 and a second amplified received communications signal 260.2. However, those skilled in the relevant art(s) may implement the communications transceiver 200 using a single component of the amplified received communications signal 260 differently in accordance with the teachings herein without departing from the spirit and scope of the present invention. The functionality of the receiver module 204 may include filtering of, decoding of, demodulating of and/or error correction of the amplified received communications signal 260. However these examples are not limiting, those skilled in the relevant art(s) may implement the receiver module 204 to include any other suitable function(s) without departing from the spirit and scope of the present invention.

The front end module 206 provides a bidirectional communications signal 262 based upon the first unamplified transmitted communications signal 258.1 and the second unamplified transmitted communications signal 258.2. Likewise, the front end module 206 provides the first amplified received communications signal 260.1 and the second amplified received communications signal 260.2 based upon the bidirectional communications signal 262. More specifically, the bidirectional communications signal 262 represents communications signal that is shared by the transmitter module 202 and the receiver module 204. As such, the bidirectional communications signal 262 may include a transmitted component and/or a received component. For example, the front end module 206 provides the transmitted component of the bidirectional communications signal 262 based upon the unamplified transmitted communications signal 258 and/or receives the received component of the bidirectional communications signal 262 to provide the amplified received communications signal 260.

The front end module 206 may operate in a half-duplex mode of operation. In the half-duplex mode of operation, the front end module 206 may operate in one of a transmit mode of operation or a receive mode of operation. In the transmit mode of operation, the front end module 206 amplifies the unamplified transmitted communications signal 258 to provide the transmitted component of the bidirectional communications signal 262. In the receive mode of operation, the front end module 206 amplifies the received component of the bidirectional communications signal 262 to provide the amplified received communications signal 260. Alternatively, the front end module 206 may operate in a full-duplex mode of operation. In the full duplex mode of operation, the front end module 206 may simultaneously operate in the transmit mode of operation or the receive mode of operation.

The channel interface module 208 provides an interface to a shared medium, such as the communications channel 104 to provide an example. More specifically, the channel interface module 208 provides a transmitted communications signal 252 based upon the bidirectional communications signal 262 and/or receives provides the bidirectional communications signal 262 based upon a received communications signal 256. The channel interface module 208 may include an interface to a copper cable, an optical-electrical converter, and/or an antenna to provide some examples. The channel interface module 208 may separately provide the transmitted communications signal 252 to the shared medium and receive the received communications signal 256 from the shared medium. Alternately, the channel interface module 208 may simultaneously provide the transmitted communications signal 252 to the shared medium and receive the received communications signal 256 from the shared medium.

Front End Module

Figure 3:
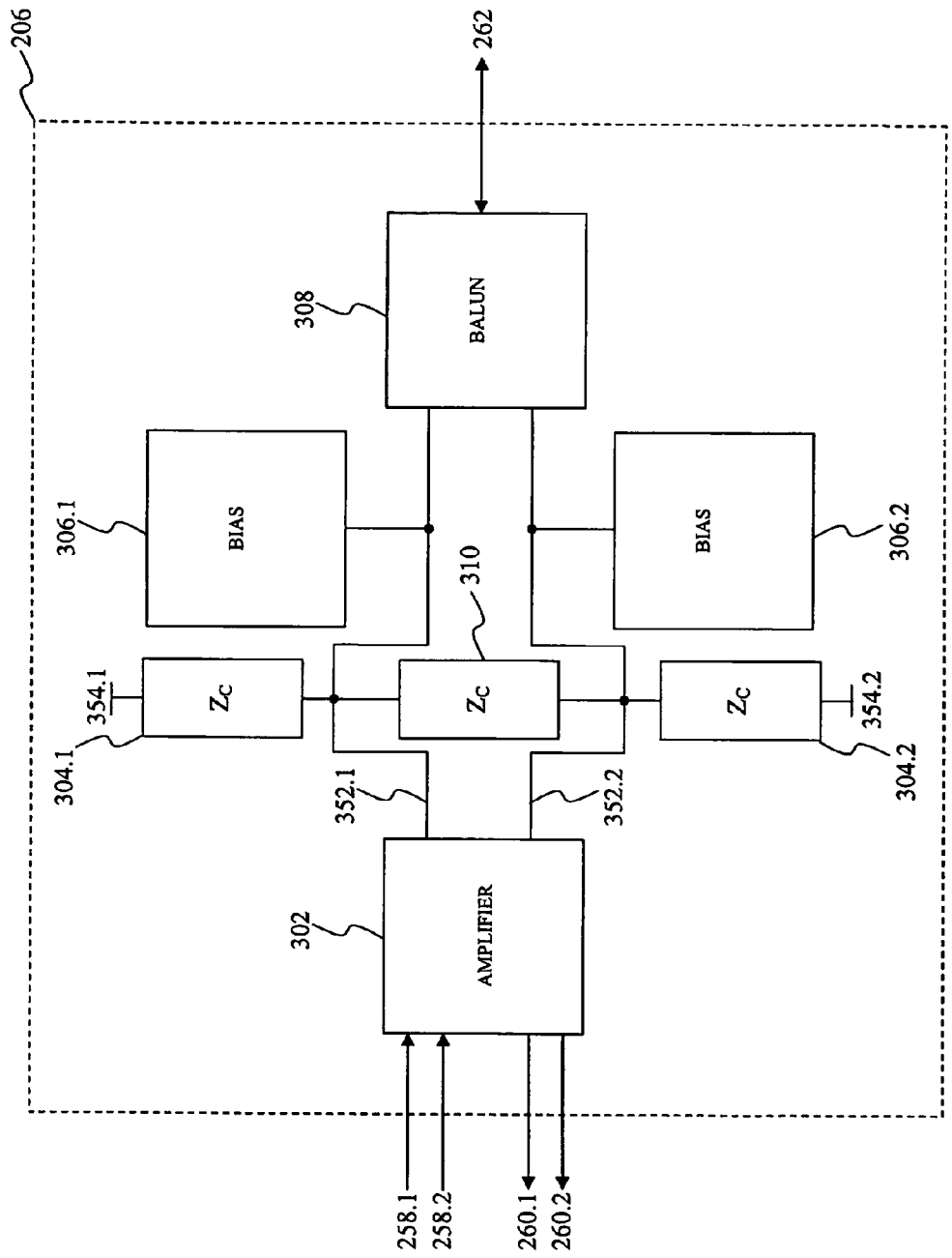
FIG. 3 illustrates a block diagram of a front end module used in the communications transceiver according to an exemplary embodiment of the present invention.

FIG. 3 illustrates a block diagram of a front end module used in the communications transceiver according to an exemplary embodiment of the present invention. The front end module 206 may operate in a half-duplex mode of operation. In the half-duplex mode of operation, the front end module 206 may operate in the transmit mode of operation and/or the receive mode of operation. For example, in the transmit mode of operation, the front end module 206 amplifies the unamplified transmitted communications signal 258 to provide the bidirectional communications signal 262, or the front end module 206 amplifies the bidirectional communications signal 262 to provide the amplified received communications signal 260 in the receive mode of operation. Alternatively, the front end module 206 may operate in a full-duplex mode of operation. In the full duplex mode of operation, the front end module 206 may simultaneously operate in the in the transmit mode of operation and the receive mode of operation to provide the amplified received communications signal 260 and the bidirectional communications signal 262. The front end module 206 includes an amplifier module 302, a matching impedance 304, a biasing module 306, a balun module 308, a matching impedance 310.

The amplifier module 302 may include a transmission amplifier, such as a power amplifier (PA) to provide an example, and/or a reception amplifier, such as a low noise amplifier (LNA) to provide an example. The amplifier module 302 may provide a bidirectional communications signal 352 based upon the unamplified transmitted communications signal 258. The bidirectional communications signal 352 may represent a differential communications signal including a first bidirectional communications signal 352.1 and a second bidirectional communications signal 352.2. The bidirectional communications signal 352 represents communications signal that is shared by the transmission amplifier and the reception amplifier. As such, the bidirectional communications signal 352 may include a transmitted component and/or a received component. For example, the amplifier module 302 provides the transmitted component of the bidirectional communications signal 352 based upon the unamplified transmitted communications signal 258 and/or receives the received component of the bidirectional communications signal 352 to provide the amplified received communications signal 260.

In the transmit mode of operation, the amplifier module 302 may amplify the first unamplified transmitted communications signal 258.1 and the second unamplified transmitted communications signal 258.2 to provide the first bidirectional communications signal 352.1 and the second bidirectional communications signal 352.2, respectively, and/or may amplify the first bidirectional communications signal 352.1 and the second bidirectional communications signal 352.2 to provide the first amplified received communications signal 260.1 and the second amplified received communications signal 260.2, respectively, in the receive mode of operation.

The matching impedance 304.1, the matching impedance 304.2, and/or the matching impedance 310 match a characteristic impedance of the channel interface module 208. The front end module 206 may include the matching impedance 304.1 and the matching impedance 304.2 to match the characteristic impedance of the channel interface module 208. Alternatively, the front end module 206 may include the matching impedance 310 to match the characteristic impedance of the channel interface module 208. In another alternative, the front end module 206 may include one or more of the matching impedance 304.1, the matching impedance 304.2, and/or the matching impedance 310 to match the characteristic impedance of the channel interface module 208.

In an exemplary embodiment, the channel interface module 208 includes an antenna to interface the shared medium. In this exemplary embodiment, an impedance $Z_C$ of the matching impedance 304.1, an impedance $Z_C$ of the matching impedance 304.2, or any combination of the matching impedance 304.1 and the matching impedance 304.2 matches a characteristic impedance of the antenna. In another exemplary embodiment, the channel interface module 208 includes a copper cable to interface the shared medium. In this exemplary embodiment, the impedance $Z_C$ of the matching impedance 304.1, the impedance $Z_C$ of the matching impedance 304.2, or any combination of the matching impedance 304.1 and the matching impedance 304.2 matches a characteristic impedance of the copper cable.

As shown in FIG. 3, the matching impedance 304.1 is coupled to the first bidirectional communications signal 352.1 and the matching impedance 304.2 is coupled to the second bidirectional communications signal 352.2. In an exemplary embodiment, the matching impedance 304.1 is coupled to a first output of the transmission amplifier and to a first input of the reception amplifier to form a first common connection. Likewise, the matching impedance 304.2 is coupled to a second output of the transmission amplifier and to a second input of the reception amplifier to form a second common connection.

The matching impedance 304.1 is configured to receive a first reference voltage and/or current 354.1. Likewise, the matching impedance 304.2 is configured to receive a second reference voltage and/or current 354.2. In an exemplary embodiment, the first reference voltage and/or current 354.1 and/or the second reference voltage and/or current 354.2 corresponds to approximately zero voltage and/or current, namely a ground potential. In another exemplary embodiment, the first biasing module 306.1 and/or the second biasing module 306.2 may provide the first reference voltage and/or current 354.1 and/or the second reference voltage and/or current 354.2, respectively.

The matching impedance 310 is coupled to the first bidirectional communications signal 352.1 and the second bidirectional communications signal 352.2. In an exemplary embodiment, a first portion of the matching impedance 310 is coupled to the first output of the transmission amplifier and to the first input of the reception amplifier to form the first common connection. Likewise, a second portion of the matching impedance 304.2 is coupled to a second output of the transmission amplifier and to a second input of the reception amplifier to form the second common connection.

The matching impedance 304.1, the matching impedance 304.2, and/or the matching impedance 310 may be implemented as a passive network including any combination of elements such as resistors, inductors, and/or capacitors. Alternatively, the matching impedance 304.1, the matching impedance 304.2, and/or the matching impedance 310 may be implemented as a combination of the passive network and an active network. In this alternate, amplifier module 302 provides part of the matching impedance 304.1, the matching impedance 304.2, and/or the matching impedance 310. In another alternate, the matching impedance 304.1, the matching impedance 304.2, and/or the matching impedance 310 may be implemented within the active network. In this alternate, the amplifier module 302 provides the matching impedance 304.1, the matching impedance 304.2, and/or the matching impedance 310.

The biasing module 306 provides one or more amplifier biases to the amplifier module 302 via the bidirectional communications signal 352. For example, in the transmit mode of operation, the first biasing module 306.1 and/or the second biasing module 306.2 provides a first amplifier bias to the amplifier module 302. In response to the first amplifier bias, the amplifier module 302 may amplify the first unamplified transmitted communications signal 258.1 and the second unamplified transmitted communications signal 258.2 to provide the first bidirectional communications signal 352.1 and the second bidirectional communications signal 352.2, respectively. Likewise, in the receive mode of operation, the first biasing module 306.1 and/or the second biasing module 306.2 provides a second amplifier bias to the amplifier module 302. In response to the second amplifier bias, the amplifier module 302 may amplify the first bidirectional communications signal 352.1 and the second bidirectional communications signal 352.2 to provide the first amplified received communications signal 260.1 and the second amplified received communications signal 260.2, respectively. The first amplifier bias and/or the second amplifier bias may include a current, a voltage, and/or any combination thereof.

The balun module 308 converts between a single ended communications signal and a differential communications signal to provide the bidirectional communications signal 262 in the transmit mode of operation or the bidirectional communications signal 352 in the receive mode of operation. In the transmit mode of operation, the balun module 308 converts the first bidirectional communications signal 352.1 and the second bidirectional communications signal 352.2 from a differential communications signal to a single ended communications signal to provide the bidirectional communications signal 262. Likewise, in the receive mode of operation, the balun module 308 converts the bidirectional communications signal 262 from the single ended communications signal to the differential communications signal to provide the first bidirectional communications signal 352.1 and the second bidirectional communications signal 352.2.

Amplifier Module

Figure 4A:
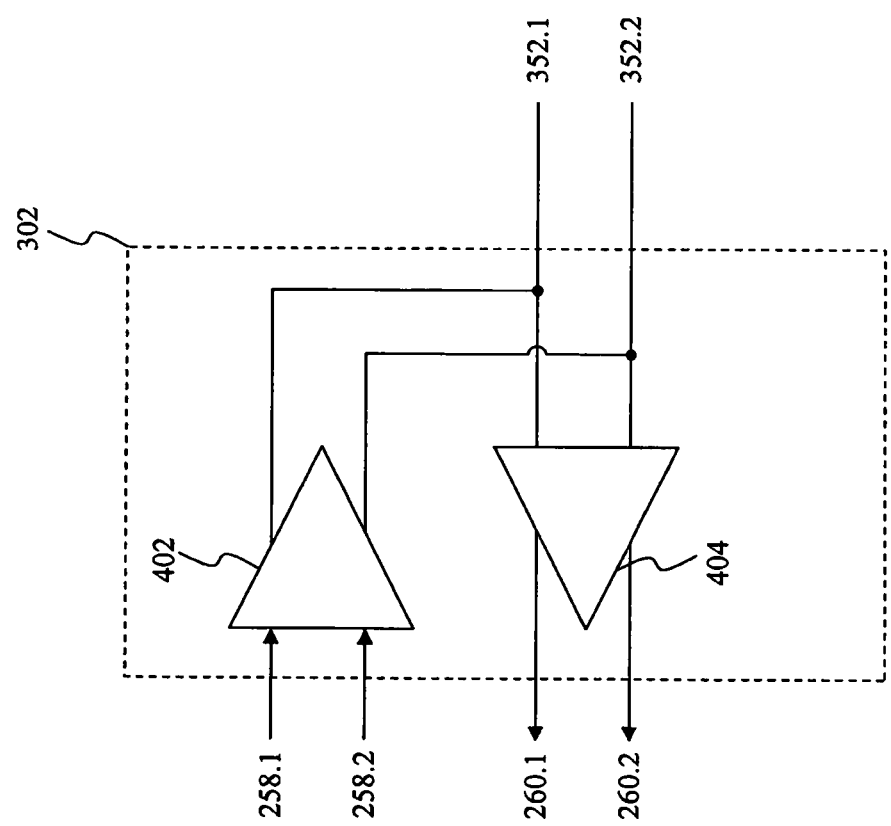
FIG. 4A illustrates a first block diagram of an amplifier module used in the front end module according to a first exemplary embodiment of the present invention.

FIG. 4A illustrates a first block diagram of an amplifier module used in the front end module according to a first exemplary embodiment of the present invention. The amplifier module 302 may amplify the first unamplified transmitted communications signal 258.1 and the second unamplified transmitted communications signal 258.2 to provide the transmitted component of the first bidirectional communications signal 352.1 and the transmitted component of the second bidirectional communications signal 352.2, respectively, and/or amplify the received component of the first bidirectional communications signal 352.1 and the received component of the second bidirectional communications signal 352.2 to provide the first amplified received communications signal 260.1 and the second amplified received communications signal 260.2, respectively. The amplifier module 302 includes a transmission amplifier 402 and a reception amplifier 404.

As shown in FIG. 4A, a first output of the transmission amplifier 402 is coupled to a first input of the reception amplifier 404 via the first bidirectional communications signal 352.1 to form the first common connection. Likewise, a second output of the transmission amplifier 402 is coupled to a second input of the reception amplifier 404 via the second bidirectional communications signal 352.2 to form the second common connection. As a result, the transmission amplifier 402 may provide the bidirectional communications signal 352 in the transmit mode of operation and/or the reception amplifier 404 may provide the amplified received communications signal 260 in the receive mode of operation. More specifically, the transmission amplifier 402 may amplify the first unamplified transmitted communications signal 258.1 and the second unamplified transmitted communications signal 258.2 to provide the first bidirectional communications signal 352.1 and the second bidirectional communications signal 352.2, respectively, in the transmit mode of operation. The reception amplifier 404 may amplify the first bidirectional communications signal 352.1 and the second bidirectional communications signal 352.2 to provide the first amplified received communications signal 260.1 and the second amplified received communications signal 260.2, respectively, in the receive mode of operation.

Figure 4B:
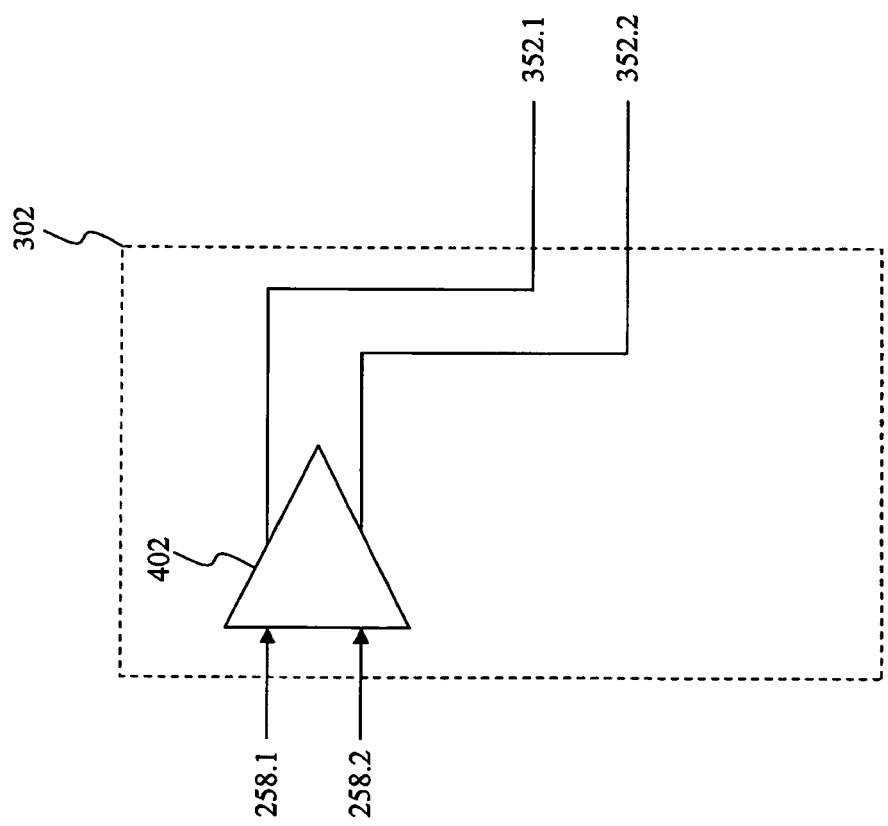
FIG. 4B illustrates a transmit mode of operation of the amplifier module according to an exemplary embodiment of the present invention.

FIG. 4B illustrates a transmit mode of operation of the amplifier module according to an exemplary embodiment of the present invention. In the transmit mode of operation, the transmission amplifier 402 and the reception amplifier 404 receive the first amplifier bias, as discussed in FIG. 3, via the first bidirectional communications signal 352.1 and/or the second bidirectional communications signal 352.2. The first amplifier bias causes the transmission amplifier 402 to enter into an active state and/or the reception amplifier 404 to enter into an inactive state. The transmission amplifier 402 amplifies the first unamplified transmitted communications signal 258.1 and the second unamplified transmitted communications signal 258.2 to provide the transmitted component of the first bidirectional communications signal 352.1 and the transmitted component of the second bidirectional communications signal 352.2, respectively, while in the active state. The reception amplifier 404 does not provide the first amplified received communications signal 260.1 and the second amplified received communications signal 260.2 while in the inactive state.

Figure 4C:
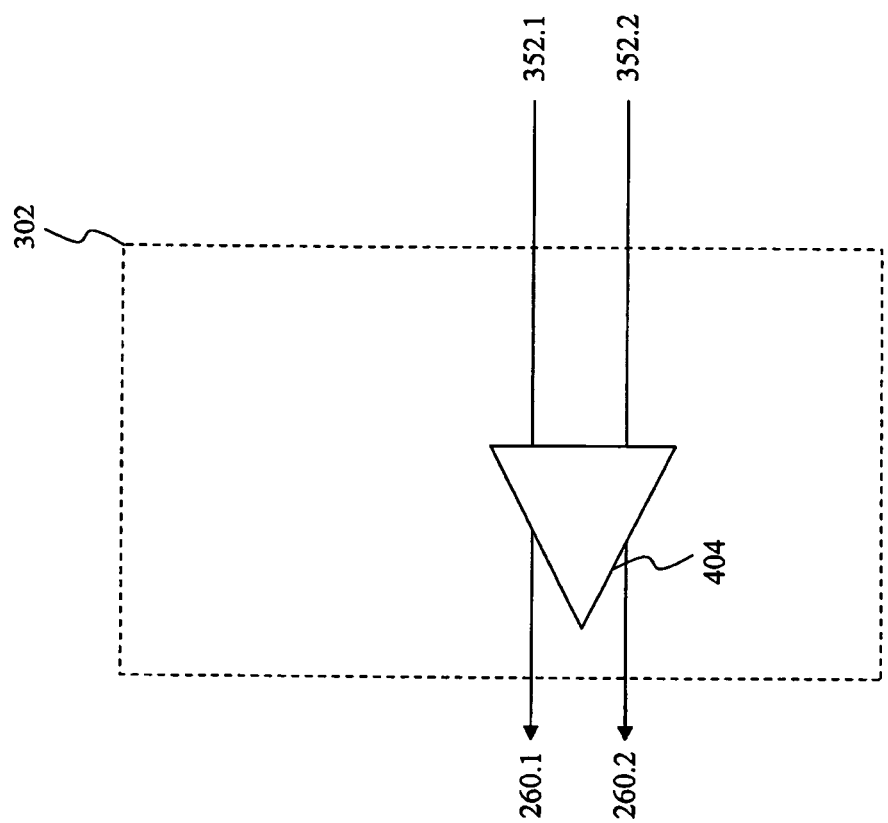
FIG. 4C illustrates a receive mode of operation of the amplifier module according to an exemplary embodiment of the present invention.

FIG. 4C illustrates a receive mode of operation of the amplifier module according to an exemplary embodiment of the present invention. In the receive mode of operation, the transmission amplifier 402 and the reception amplifier 404 receive the second amplifier bias, as discussed in FIG. 3, via the first bidirectional communications signal 352.1 and/or the second bidirectional communications signal 352.2. The second amplifier bias causes the transmission amplifier 402 to enter into the inactive state and/or the reception amplifier 404 to enter into the active state. The reception amplifier 404 amplifies the received component of the first bidirectional communications signal 352.1 and the received component of the second bidirectional communications signal 352.2 to provide the first amplified received communications signal 260.1 and the second amplified received communications signal 260.2, respectively, while in the active state. The transmission amplifier 402 does not provide the transmitted component the first bidirectional communications signal 352.1 and the transmitted component the second bidirectional communications signal 352.2 while in the inactive state.

Figure 5:
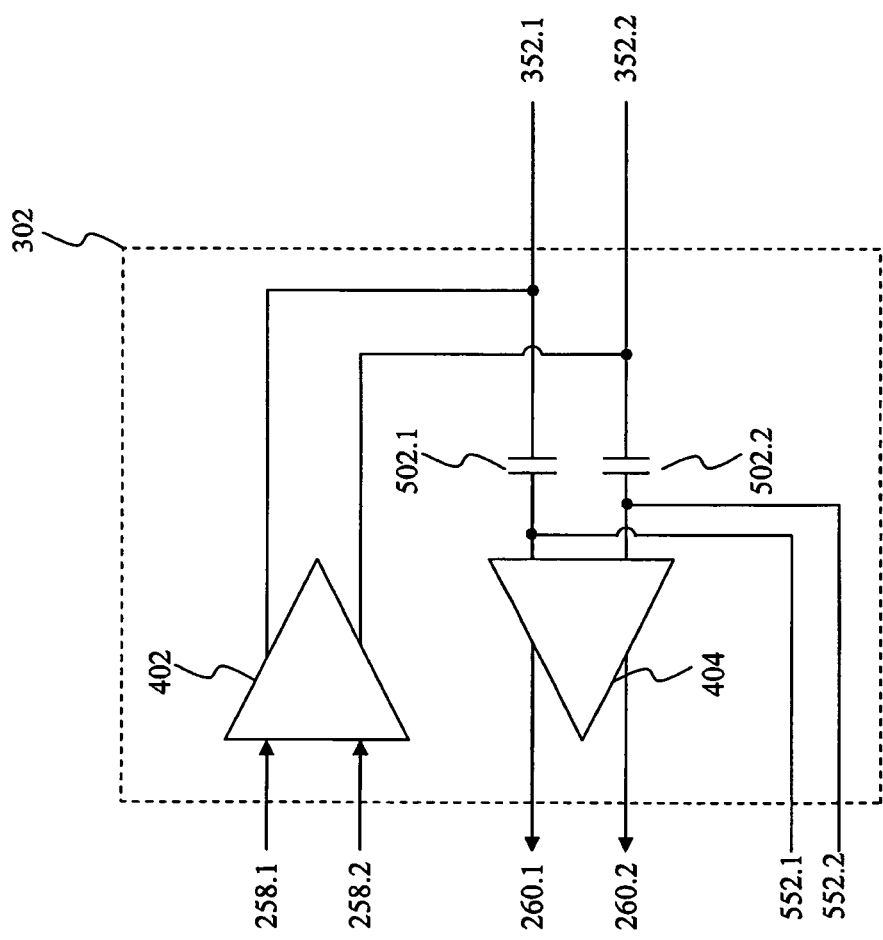
FIG. 5 illustrates a second block diagram of the amplifier module used in the front end module according to a second exemplary embodiment of the present invention.

FIG. 5 illustrates a second block diagram of the amplifier module used in the front end module according to a second exemplary embodiment of the present invention. The amplifier module 302 may amplify the first unamplified transmitted communications signal 258.1 and the second unamplified transmitted communications signal 258.2 to provide the transmitted component of the first bidirectional communications signal 352.1 and the transmitted component of the second bidirectional communications signal 352.2, respectively, and/or amplify the received component of the first bidirectional communications signal 352.1 and the received component of the second bidirectional communications signal 352.2 to provide the first amplified received communications signal 260.1 and the second amplified received communications signal 260.2, respectively. The amplifier module 302 includes the transmission amplifier 402, the reception amplifier 404, and a capacitor 502. The transmission amplifier 402 operates in a substantially similar manner as described in FIG. 4A through 4C, thus only the reception amplifier 404 will be described in further detail.

As shown in FIG. 5, the first output of the transmission amplifier 402 is coupled to a first portion of the first capacitor 502.1 to form the first common connection. A second portion of the first capacitor 502.1 is coupled to the first input of the reception amplifier 404. Likewise, the second output of the transmission amplifier 402 is coupled to a first portion of the second capacitor 502.2 to form the second common connection. A second portion of the second capacitor 502.2 is coupled to the second input of the reception amplifier 404. However, this example is not limiting, those skilled in the relevant art(s) may implement a substantially similar capacitor at the first output of the transmission amplifier 402 and/or the second output of the transmission amplifier 402 differently in accordance with the teachings herein without departing from the sprit and scope of the present invention.

The first capacitor 502.1 prevents the first amplifier bias and/or the second amplifier bias, as discussed in FIG. 3, from being provided to the reception amplifier 404 via the first bidirectional communications signal 352.1 in the transmit mode of operation and/or the receive mode of operation. Likewise, the second capacitor 502.2 prevents the first amplifier bias and/or the second amplifier bias from being provided to the reception amplifier 404 via the second bidirectional communications signal 352.2 in the transmit mode of operation and/or the receive mode of operation.

The reception amplifier 404 receives a first bias voltage and/or current 552.1 via the first input and a second bias voltage and/or current 552.2 via the second input. The first bias voltage and/or current 552.1 and/or the second bias voltage and/or current 552.2 causes the reception amplifier 404 to enter into the active state. The reception amplifier 404 amplifies the received component of the first bidirectional communications signal 352.1 and the received component of the second bidirectional communications signal 352.2 to provide the first amplified received communications signal 260.1 and the second amplified received communications signal 260.2, respectively, while in the active state. The first bias voltage and/or current 552.1 and/or the second bias voltage and/or current 552.2 allows the reception amplifier 404 to be operated independently from the first amplifier bias and/or the second amplifier bias. As a result, the reception amplifier 404 may provide the first amplified received communications signal 260.1 and the second amplified received communications signal 260.2 continuously, in the transmit mode of operation only, in the receive mode of operation only, or for any other suitable duration in time.

Figure 6:
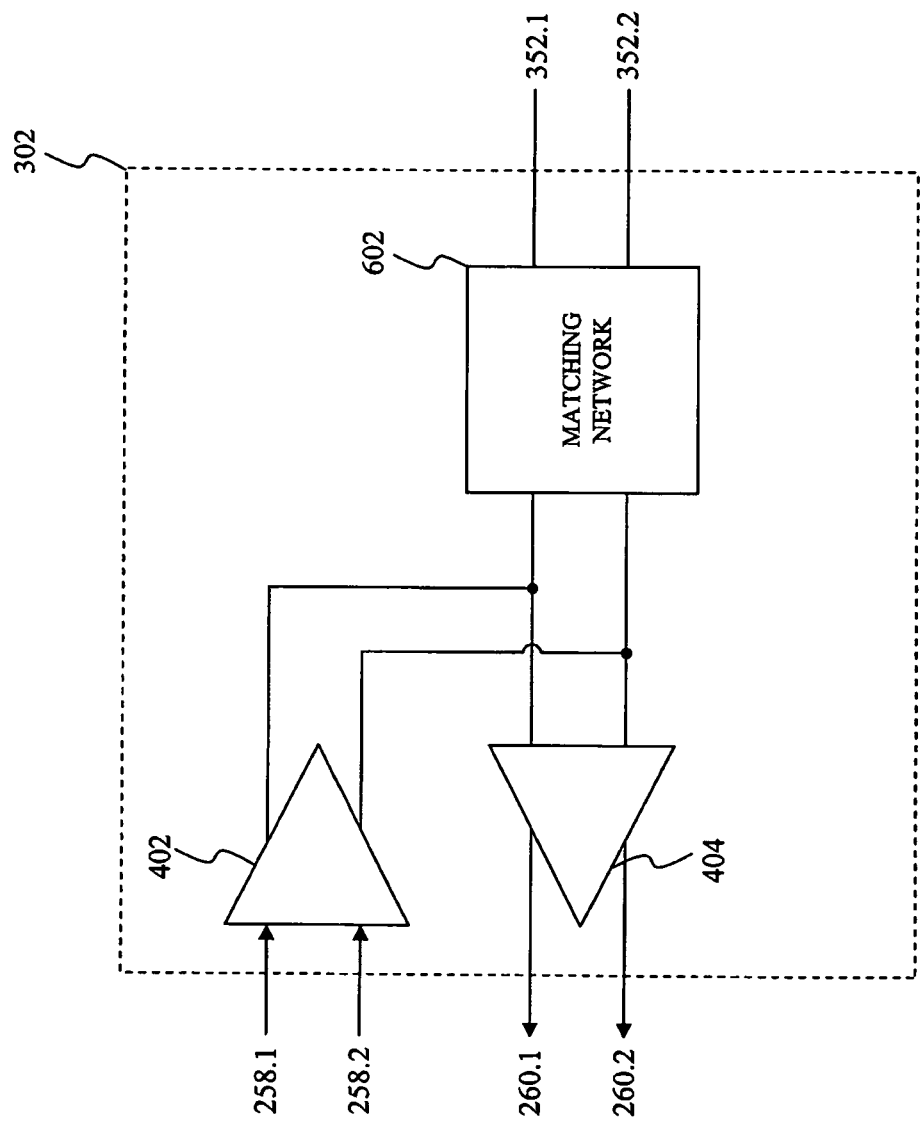
FIG. 6 illustrates a third block diagram of the amplifier module used in the front end module according to a third exemplary embodiment of the present invention.

FIG. 6 illustrates a third block diagram of the amplifier module used in the front end module according to a third exemplary embodiment of the present invention. The amplifier module 302 may amplify the first unamplified transmitted communications signal 258.1 and the second unamplified transmitted communications signal 258.2 to provide the transmitted component of the first bidirectional communications signal 352.1 and the transmitted component of the second bidirectional communications signal 352.2, respectively, and/or amplify the received component of the first bidirectional communications signal 352.1 and the received component of the second bidirectional communications signal 352.2 to provide the first amplified received communications signal 260.1 and the second amplified received communications signal 260.2, respectively. The amplifier module 302 includes the transmission amplifier 402, the reception amplifier 404, and a matching network 602. The amplifier module 302 operates in a substantially similar manner as described in FIG. 4A through 4C, thus only the matching network 602 will be described in further detail.

The matching network 602 matches a characteristic impedance of the channel interface module 208. For example, in an exemplary embodiment, the channel interface module 208 includes an antenna to interface the shared medium. In this exemplary embodiment, an impedance $Z_C$ of the matching network 602 matches a characteristic impedance of the antenna. In another exemplary embodiment, the channel interface module 208 includes a copper cable to interface the shared medium. In this exemplary embodiment, the impedance $Z_C$ of the matching network 602 matches a characteristic impedance of the copper cable. The matching network 602 may be implemented as a $3^{rd}$ order Pi-Network, a $5^{th}$ order Pi-network, or any other suitable order Pi-network or any other well known matching network, such as a L matching network or a T matching network to provide some examples.

Figure 7A:
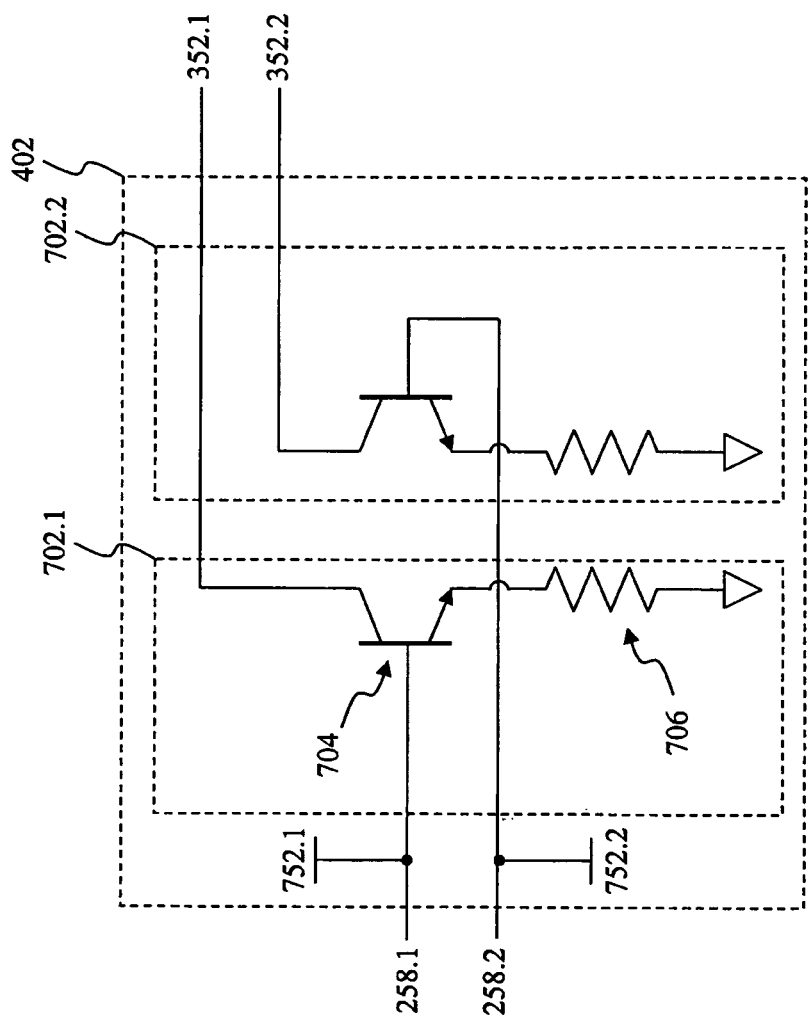
FIG. 7A illustrates a first block diagram of a transmission amplifier used in the amplifier module according to a first exemplary embodiment of the present invention.

FIG. 7A illustrates a first block diagram of a transmission amplifier used in the amplifier module according to a first exemplary embodiment of the present invention. The transmission amplifier 402 includes a common-emitter amplifier module 702. The common-emitter amplifier module 702 may include a first common-emitter amplifier 702.1 and a second common-emitter amplifier 702.2. However, this example is not limiting, those skilled in the relevant art(s) may implement the transmission amplifier 402 using any suitable topology, such as common-base or common-collector to provide some examples, without departing from the spirit and scope of the present invention.

The common-emitter amplifier module 702 includes a first common-emitter amplifier 702.1 and a second common-emitter amplifier 702.2. The first common-emitter amplifier 702.1 includes a transistor 704 and a resistor 706. Alternatively, those in the skilled in the relevant art(s) may implement the common-emitter amplifier module 702 using a tail current and/or a ground source instead of the resistor 706 differently based upon the teachings herein without departing from the spirit and scope of the present invention. The transistor 704 enters into an active state when a voltage at a collector of the transistor 704 is greater than a voltage at a base of the transistor 704. Alternatively, those in the skilled in the relevant art(s) may implement the transistor 704 in complementary metal oxide silicon (CMOS) differently based upon the teachings herein without departing from the spirit and scope of the present invention. In the active state, the transistor 704 amplifies the first unamplified transmitted communications signal 258.1 to provide the first bidirectional communications signal 352.1. However, when the voltage at the collector is less than or equal to the voltage at the base, the transistor 704 enters into an inactive state. In the inactive state, the transistor 704 does not provide the first bidirectional communications signal 352.1.

The first common-emitter amplifier 702.1 receives a first transmission bias 752.1 via the first unamplified transmitted communications signal 258.1 and either the first amplifier bias, as discussed in FIG. 3, in the transmit mode of operation or the second amplifier bias, as discussed in FIG. 3, in the receive mode of operation. The first transmission bias 752.1 is selected such that a difference between the first amplifier bias and the first transmission bias 752.1 causes the transistor 704 to enter into the active state in the transmit mode of operation and/or a difference between the second amplifier bias and the first transmission bias 752.1 causes the transistor 704 to enter into the inactive state in the receive mode of operation. More specifically, the first transmission bias 752.1 is selected such that the first amplifier bias causes the voltage at the collector of the transistor 704 to be greater than the voltage at the base of the transistor 704 and the second amplifier bias causes the voltage at the collector of the transistor 704 to be lesser than the voltage at the base of the transistor 704. In an exemplary embodiment, the first transmission bias 752.1 is greater than the second amplifier bias and less than the first amplifier bias.

Alternatively, the first transmission bias 752.1 is selected such that the first amplifier bias causes the voltage at the collector of the transistor 704 to be greater than the voltage at the base of the transistor 704. The first transmission bias 752.1 may be decreased such that the second amplifier bias causes the voltage at the collector of the transistor 704 to be lesser than the voltage at the base of the transistor 704 to cause the transistor 704 to enter into the inactive state. The first transmission bias 752.1 may be increase such that the first amplifier bias causes the voltage at the collector of the transistor 704 to be greater than the voltage at the base of the transistor 704 to cause the transistor 704 to enter into the active state.

The second common-emitter amplifier 702.2 operates in a substantially similar manner as the first common-emitter amplifier 702.1 and will not be described in further detail. Those skilled in the relevant art(s) will recognize that the transmission amplifier 402 may include more than one common-emitter amplifier modules 702 having one or more gains with their respective bases coupled together to form a first base node and their respective collectors coupled together to form a first collector node without departing from the spirit and scope of the present invention.

Figure 7B:
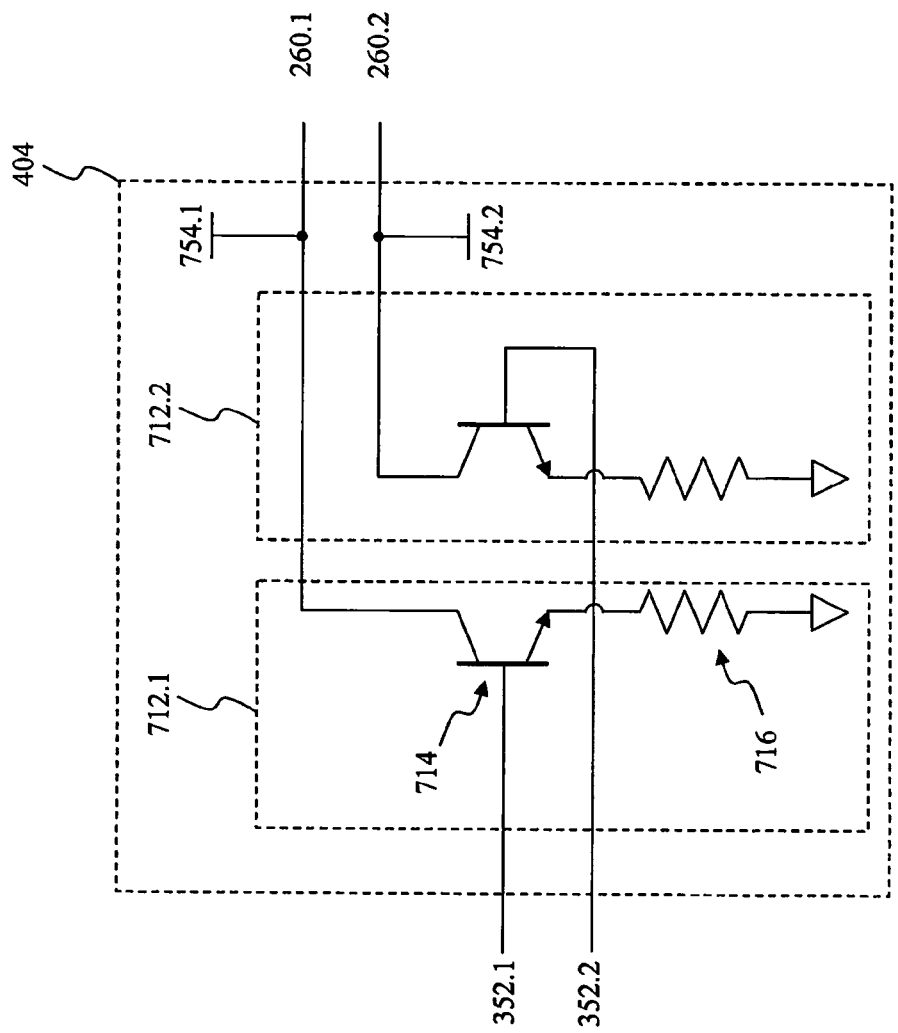
FIG. 7B illustrates a first block diagram of a reception amplifier used in the amplifier module according to a first exemplary embodiment of the present invention.

FIG. 7B illustrates a first block diagram of a reception amplifier used in the amplifier module according to a first exemplary embodiment of the present invention. The reception amplifier 404 includes a common-emitter amplifier module 712. The common-emitter amplifier module 712 may include a first common-emitter amplifier 712.1 and a second common-emitter amplifier 712.2. However, this example is not limiting, those skilled in the relevant art(s) may implement the reception amplifier 404 using any suitable topology, such as common-base or common-collector to provide some examples, without departing from the spirit and scope of the present invention.

The common-emitter amplifier module 712 includes a first common-emitter amplifier 712.1 and a second common-emitter amplifier 712.2. The first common-emitter amplifier 712.1 includes a transistor 714 and a resistor 716. Alternatively, those in the skilled in the relevant art(s) may implement the common-emitter amplifier module 712 using a tail current and/or a ground source instead of the resistor 716 differently based upon the teachings herein without departing from the spirit and scope of the present invention. The transistor 714 enters into an active state when a voltage at a collector of the transistor 714 is greater than a voltage at a base of the transistor 714. Alternatively, those in the skilled in the relevant art(s) may implement the transistor 714 in complementary metal oxide silicon (CMOS) differently based upon the teachings herein without departing from the spirit and scope of the present invention. In the active state, the transistor 714 amplifies the first bidirectional communications signal 352.1 to provide the amplified received communications signal 260.1. However, when the voltage at the collector is less than or equal to the voltage at the base, the transistor 714 enters into an inactive state. In the inactive state, the transistor 714 does not provide the amplified received communications signal 260.1.

The first common-emitter amplifier 712.1 receives a first reception bias 754.1 via the amplified received communications signal 260.1 and either the first amplifier bias, as discussed in FIG. 3, in the transmit mode of operation or the second amplifier bias, as discussed in FIG. 3, in the receive mode of operation. The first reception bias 754.1 is selected such that a difference between the second amplifier bias and the first reception bias 754.1 causes the transistor 714 to enter into the active state in the receive mode of operation and/or a difference between the first amplifier bias and the first reception bias 754.1 causes the transistor 714 to enter into the inactive state in the transmit mode of operation. More specifically, the first reception bias 754.1 is selected such that the second amplifier bias causes the voltage at the collector of the transistor 714 to be greater than the voltage at the base of the transistor 714 and the first amplifier bias causes the voltage at the collector of the transistor 714 to be lesser than the voltage at the base of the transistor 714.

Alternatively, the first reception bias 754.1 is selected such that the second amplifier bias causes the voltage at the collector of the transistor 714 to be greater than the voltage at the base of the transistor 714. The first reception bias 754.1 may be decreased such that the first amplifier bias causes the voltage at the collector of the transistor 714 to be lesser than the voltage at the base of the transistor 714 to cause the transistor 714 to enter into the inactive state. The first reception bias 754.1 may be increased such that the second amplifier bias causes the voltage at the collector of the transistor 714 to be greater than the voltage at the base of the transistor 714 to cause the transistor 714 to enter into the active state.

The second common-emitter amplifier 712.2 operates in a substantially similar manner as the first common-emitter amplifier 712.1 and will not be described in further detail. Those skilled in the relevant art(s) will recognize that the reception amplifier 404 may include more than one common-emitter amplifier modules 702 having one or more gains with their respective bases coupled together to form a first base node and their respective collectors coupled together to form a first collector node without departing from the spirit and scope of the present invention.

Figure 8A:
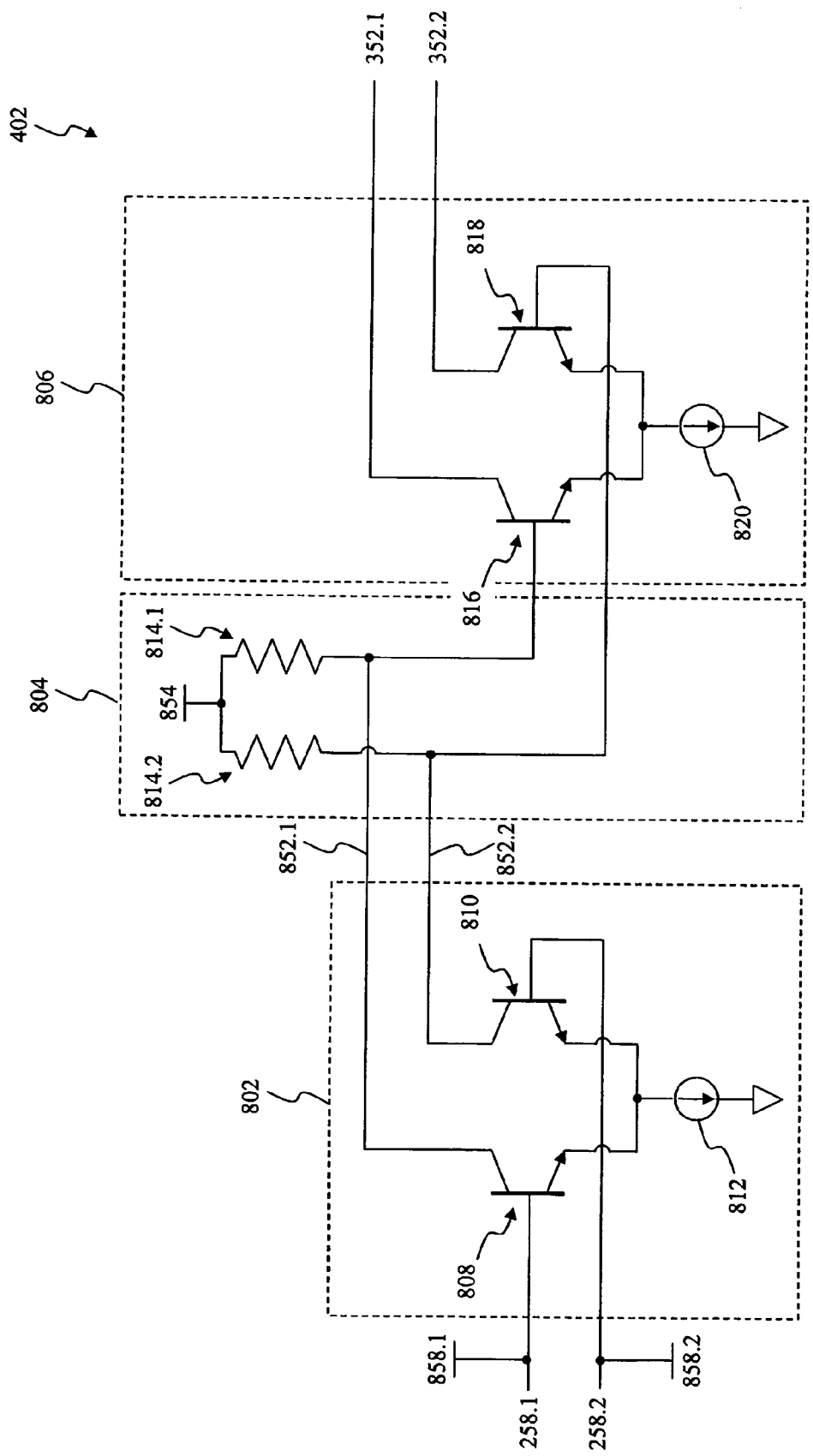
FIG. 8A illustrates a second block diagram of the transmission amplifier used in the amplifier module according to a second exemplary embodiment of the present invention.

FIG. 8A illustrates a second block diagram of the transmission amplifier used in the amplifier module according to a second exemplary embodiment of the present invention. The transmission amplifier 402 includes a first stage 802, a biasing module 804, and a second stage 806. The first stage 802 amplifies the first unamplified transmitted communications signal 258.1 and the second unamplified transmitted communications signal 258.2 to provide a first intermediate communications signal 852.1 and a second intermediate communications signal 852.2, respectively. The first stage 802 includes a transistor 808, a transistor 810, and a current source 812 configured to operate as a differential amplifier. Alternatively, those in the skilled in the relevant art(s) may implement the first stage 802 using a resistor and/or a ground source instead of current source 812 differently based upon the teachings herein without departing from the spirit and scope of the present invention. However, this example is not limiting, those skilled in the relevant art(s) may implement the first stage 802 using any suitable topology without departing from the spirit and scope of the present invention. Those skilled in the relevant art(s) will recognize that the transmission amplifier 402 may include more than one first stages 802 including one or more gains connected in parallel in circuit including one or more gains without departing from the spirit and scope of the present invention. For example, each one of the first stages 802 includes the transistor 808 having their respective bases coupled to the first unamplified transmitted communications signal 258.1 to form a first base node and their respective collectors coupled to the first intermediate communications signal 852.1 to form a first collector node and the transistor 810 having their respective bases coupled to the first unamplified transmitted communications signal 258.1 to form a second base node and their respective collectors coupled to the second intermediate communications signal 852.2 to form a second collector node. Alternatively, those in the skilled in the relevant art(s) may implement the transistor 808 and/or the transistor 810 in complementary metal oxide silicon (CMOS) differently based upon the teachings herein without departing from the spirit and scope of the present invention.

The transistor 808 and/or the transistor 810 enters into an active state when a voltage at a collector of the transistor 808 and/or the transistor 810 is greater than a voltage at a base of the transistor 808 and/or the transistor 810. In the active state, the transistor 808 and/or the transistor 810 amplifies the first unamplified transmitted communications signal 258.1 and the second unamplified transmitted communications signal 258.2 to provide the first intermediate communications signal 852.1 and the second intermediate communications signal 852.2, respectively. However, when the voltage at the collector is less than or equal to the voltage at the base, the transistor 808 and/or the transistor 810 enters into an inactive state. In the inactive state, the transistor 808 and/or the transistor 810 does not provide the first intermediate communications signal 852.1 and the second intermediate communications signal 852.2.

The first stage 802 receives a first transmission bias 858.1 via the first unamplified transmitted communications signal 258.1 and a second transmission bias 858.2 via the second unamplified transmitted communications signal 258.2 and/or a fixed bias 854 via the first intermediate communications signal 852.1 and the second intermediate communications signal 852.2. The first transmission bias 858.1 and/or the second transmission bias 858.2 may be selected such that a difference between the fixed bias 854 and the first transmission bias 858.1 and/or the second transmission bias 858.2 causes the transistor 808 and/or the transistor 810 to enter into the active state in the transmit mode of operation. The fixed bias 854 and/or the first transmission bias 858.1 and/or the second transmission bias 858.2 are selected such that the first amplifier bias, as discussed in FIG. 3, causes the voltage at the collector of the transistor 808 and/or the transistor 810 to be greater than the voltage at the base of the transistor

808. Alternatively, the first transmission bias 858.1 and/or the second transmission bias 858.2 may be selected such that a difference between the fixed bias 854 and the first transmission bias 858.1 and/or the second transmission bias 858.2 causes the transistor 808 and/or the transistor 810 to enter into the inactive state in the receive mode of operation. In this alternate, the fixed bias 854 and/or the first transmission bias 858.1 and/or the second transmission bias 858.2 are selected such that the second amplifier bias, as discussed in FIG. 3, causes the voltage at the collector of the transistor 808 and/or the transistor 810 to be lesser than the voltage at the base of the transistor 808 and/or the transistor 810.

The biasing module 804 provides the fixed bias 854 to the first stage 802 and the second stage 806. The biasing module 804 includes a first resistor 814.1 and a second resistor 814.2. The first resistor 814.1 provides the fixed bias 854 to the collector of the transistor 808 and/or to a base of a transistor 816. Likewise, the second resistor 814.2 provides the fixed bias 854 to the collector of the transistor 810 and/or to a base of a transistor 818.

The second stage 806 amplifies the first intermediate communications signal 852.1 and the second intermediate communications signal 852.2 to provide the first bidirectional communications signal 352.1 and the second bidirectional communications signal 352.2, respectively. The second stage 806 includes a transistor 816, a transistor 818, and a current source 820 configured to operate as a differential amplifier. Alternatively, those in the skilled in the relevant art(s) may implement the second stage 806 using a resistor and/or a ground source instead of current source 820 differently based upon the teachings herein without departing from the spirit and scope of the present invention. However, this example is not limiting, those skilled in the relevant art(s) may implement the second stage 806 using any suitable topology without departing from the spirit and scope of the present invention. The transistor 816 and/or the transistor 818 enters into an active state when a voltage at a collector of the transistor 816 and/or the transistor 818 is greater than a voltage at a base of the transistor 816 and/or the transistor 818. Alternatively, those in the skilled in the relevant art(s) may implement the transistor 816 and/or the transistor 818 in complementary metal oxide silicon (CMOS) differently based upon the teachings herein without departing from the spirit and scope of the present invention. In the active state, the transistor 816 and/or the transistor 818 amplifies first intermediate communications signal 852.1 and the second intermediate communications signal 852.2 to provide the first bidirectional communications signal 352.1 and the second bidirectional communications signal 352.2, respectively. However, when the voltage at the collector is less than or equal to the voltage at the base, the transistor 816 and/or the transistor 818 enters into an inactive state. In the inactive state, the transistor 816 and/or the transistor 818 does not provide the first bidirectional communications signal 352.1 and the second bidirectional communications signal 352.2.

The second stage 806 receives the fixed bias 854 via the first intermediate communications signal 852.1 and the second intermediate communications signal 852.2 and/or either the first amplifier bias or the second amplifier bias via the first bidirectional communications signal 352.1 and the second bidirectional communications signal 352.2. The fixed bias 854 may be selected such that a difference between the fixed bias 854 and the first amplifier bias causes the transistor 816 and/or the transistor 818 to enter into the active state in the transmit mode of operation. The fixed bias 854 may be selected such that the first amplifier bias, as discussed in FIG. 3, causes the voltage at the collector of the transistor 816 and/or the transistor 818 to be greater than the voltage at the base of the transistor 816 and/or the transistor 818. Alternatively, the fixed bias 854 may be selected such that a difference between the fixed bias 854 and the second amplifier bias causes the transistor 816 and/or the transistor 818 to enter into the inactive state in the receive mode of operation. In this alternate, the fixed bias 854 may be selected such that the second amplifier bias, as discussed in FIG. 3, causes the voltage at the collector of the transistor 816 and/or the transistor 818 to be lesser than the voltage at the base of the transistor 816 and/or the transistor 818.

Figure 8B:
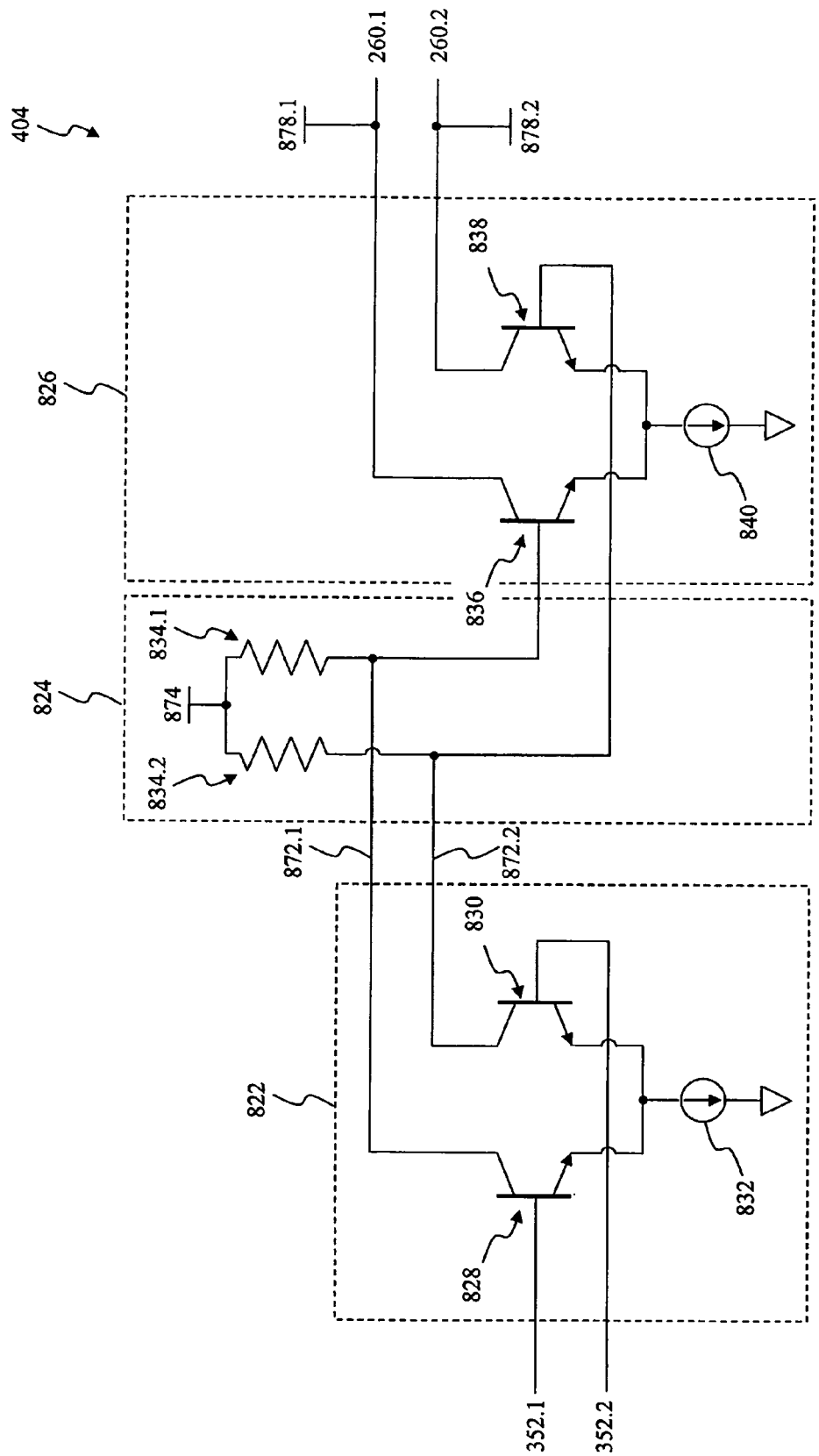
FIG. 8B illustrates a second block diagram of the reception amplifier used in the amplifier module according to a second exemplary embodiment of the present invention.

FIG. 8B illustrates a second block diagram of the reception amplifier used in the amplifier module according to a second exemplary embodiment of the present invention. The reception amplifier 404 includes a first stage 822, a biasing module 824, and a second stage 826. The first stage 822 amplifies the first bidirectional communications signal 352.1 and the second bidirectional communications signal 352.2 to provide a first intermediate communications signal 872.1 and a second intermediate communications signal 872.2, respectively. The first stage 822 includes a transistor 828, a transistor 830, and a current source 832 configured to operate as a differential amplifier. Alternatively, those in the skilled in the relevant art(s) may implement the first stage 822 using a resistor and/or a ground source instead of current source 832 differently based upon the teachings herein without departing from the spirit and scope of the present invention. However, this example is not limiting, those skilled in the relevant art(s) may implement the first stage 822 using any suitable topology without departing from the spirit and scope of the present invention. Those skilled in the relevant art(s) will recognize that the reception amplifier 404 may include more than one first stages 822 connected in parallel in circuit including one or more gains without departing from the spirit and scope of the present invention. For example, each one of the first stages 822 includes the transistor 828 having their respective bases coupled to the first bidirectional communications signal 352.1 to form a first base node and their respective collectors coupled to the first intermediate communications signal 872.1 to form a first collector node and the transistor 810 having their respective bases coupled to the second bidirectional communications signal 352.2 to form a second base node and their respective collectors coupled to the second intermediate communications signal 872.2 to form a second collector node. Alternatively, those in the skilled in the relevant art(s) may implement the transistor 828 and/or the transistor 830 in complementary metal oxide silicon (CMOS) differently based upon the teachings herein without departing from the spirit and scope of the present invention.

The transistor 828 and/or the transistor 830 enters into an active state when a voltage at a collector of the transistor 828 and/or the transistor 830 is greater than a voltage at a base of the transistor 828 and/or the transistor 830. In the active state, the transistor 828 and/or the transistor 830 amplifies the first bidirectional communications signal 352.1 and the second bidirectional communications signal 352.2 to provide the first intermediate communications signal 872.1 and the second intermediate communications signal 872.2, respectively. However, when the voltage at the collector is less than or equal to the voltage at the base, the transistor 828 and/or the transistor 830 enters into an inactive state. In the inactive state, the transistor 828 and/or the transistor 830 does not provide the first intermediate communications signal 872.1 and the second intermediate communications signal 872.2.

The first stage 822 receives a fixed bias 878 via the first intermediate communications signal 872.1 and the second intermediate communications signal 872.2 and/or either the first amplifier bias or the second amplifier bias via the first bidirectional communications signal 352.1 and the second bidirectional communications signal 352.2. The fixed bias 874 may be selected such that a difference between the fixed bias 874 and the second amplifier bias causes the transistor 828 and/or the transistor 830 to enter into the active state in the receive mode of operation. The fixed bias 874 may be selected such that the second amplifier bias, as discussed in FIG. 3, causes the voltage at the collector of the transistor 828 and/or the transistor 830 to be greater than the voltage at the base of the transistor 828 and/or the transistor 830. Alternatively, the fixed bias 874 may be selected such that a difference between the fixed bias 874 and the first amplifier bias causes the transistor 828 and/or the transistor 830 causes the transistor 828 and/or the transistor 830 to enter into the inactive state in the transmit mode of operation. In this alternate, the fixed bias 874 is selected such that the first amplifier bias, as discussed in FIG. 3, causes the voltage at the collector of the transistor 828 and/or the transistor 830 to be lesser than the voltage at the base of the transistor 828 and/or the transistor 830.

The biasing module 824 provides the fixed bias 874 to the first stage 822 and the second stage 826. The biasing module 824 includes first resistor 834.1 and a second resistor 834.2. The resistor 834 provides the fixed bias 874 to the collector of the transistor 828 and/or to a base of a transistor 836. Alternatively, those in the skilled in the relevant art(s) may implement the transistor 836 and/or the transistor 838 in complementary metal oxide silicon (CMOS) differently based upon the teachings herein without departing from the spirit and scope of the present invention. Likewise, the second resistor 834.2 provides the fixed bias 874 to the collector of the transistor 830 and/or to a base of a transistor 838.

The second stage 826 amplifies the first intermediate communications signal 872.1 and the second intermediate communications signal 872.2 to provide the first amplified received communications signal 260.1 and the second amplified received communications signal 260.2, respectively. The second stage 826 includes a transistor 836, a transistor 838, and a current source 840 configured to operate as a differential amplifier. Alternatively, those in the skilled in the relevant art(s) may implement the second stage 826 using a resistor and/or a ground source instead of current source 840 differently based upon the teachings herein without departing from the spirit and scope of the present invention. However, this example is not limiting, those skilled in the relevant art(s) may implement the second stage 826 using any suitable topology without departing from the spirit and scope of the present invention. The transistor 836 and/or the transistor 838 enters into an active state when a voltage at a collector of the transistor 836 and/or the transistor 838 is greater than a voltage at a base of the transistor 836 and/or the transistor 838. In the active state, the transistor 836 and/or the transistor 838 amplifies the first intermediate communications signal 872.1 and the second intermediate communications signal 872.2 to provide the first amplified received communications signal 260.1 and the second amplified received communications signal 260.2, respectively. However, when the voltage at the collector is less than or equal to the voltage at the base, the transistor 836 and/or the transistor 838 enters into an inactive state. In the inactive state, the transistor 836 and/or the transistor 838 does not provide the first amplified received communications signal 260.1 and the second amplified received communications signal 260.2.

The second stage 826 receives the fixed bias 874 via the first intermediate communications signal 872.1 and the second intermediate communications signal 872.2 and/or a first reception bias 878.1 via the first amplified received communications signal 260.1 and a second reception bias 878.2 via the second amplified received communications signal 260.2. The first reception bias 878.1 and/or the second reception bias 878.2 may be selected such that a difference between the fixed bias 874 and the first reception bias 878.1 and/or the second reception bias 878.2 causes the transistor 836 and/or the transistor 838 to enter into the active state in the receive mode of operation. The fixed bias 874 and/or first reception bias 878.1 and/or the second reception bias 878.2 are selected such that the second amplifier bias, as discussed in FIG. 3, causes the voltage at the collector of the transistor 836 and/or the transistor 838 to be greater than the voltage at the base of the transistor 836 and/or the transistor 838. Alternatively, first reception bias 878.1 and/or the second reception bias 878.2 may be selected such that a difference between the fixed bias 874 and the first reception bias 878.1 and/or the second reception bias 878.2 causes the transistor 836 and/or the transistor 838 to enter into the inactive state in the transmit mode of operation. The fixed bias 874 and/or first reception bias 878.1 and/or the second reception bias 878.2 are selected such that the first amplifier bias, as discussed in FIG. 3, causes the voltage at the collector of the transistor 836 and/or the transistor 838 to be lesser than the voltage at the base of the transistor 836 and/or the transistor 838

Figure 9:
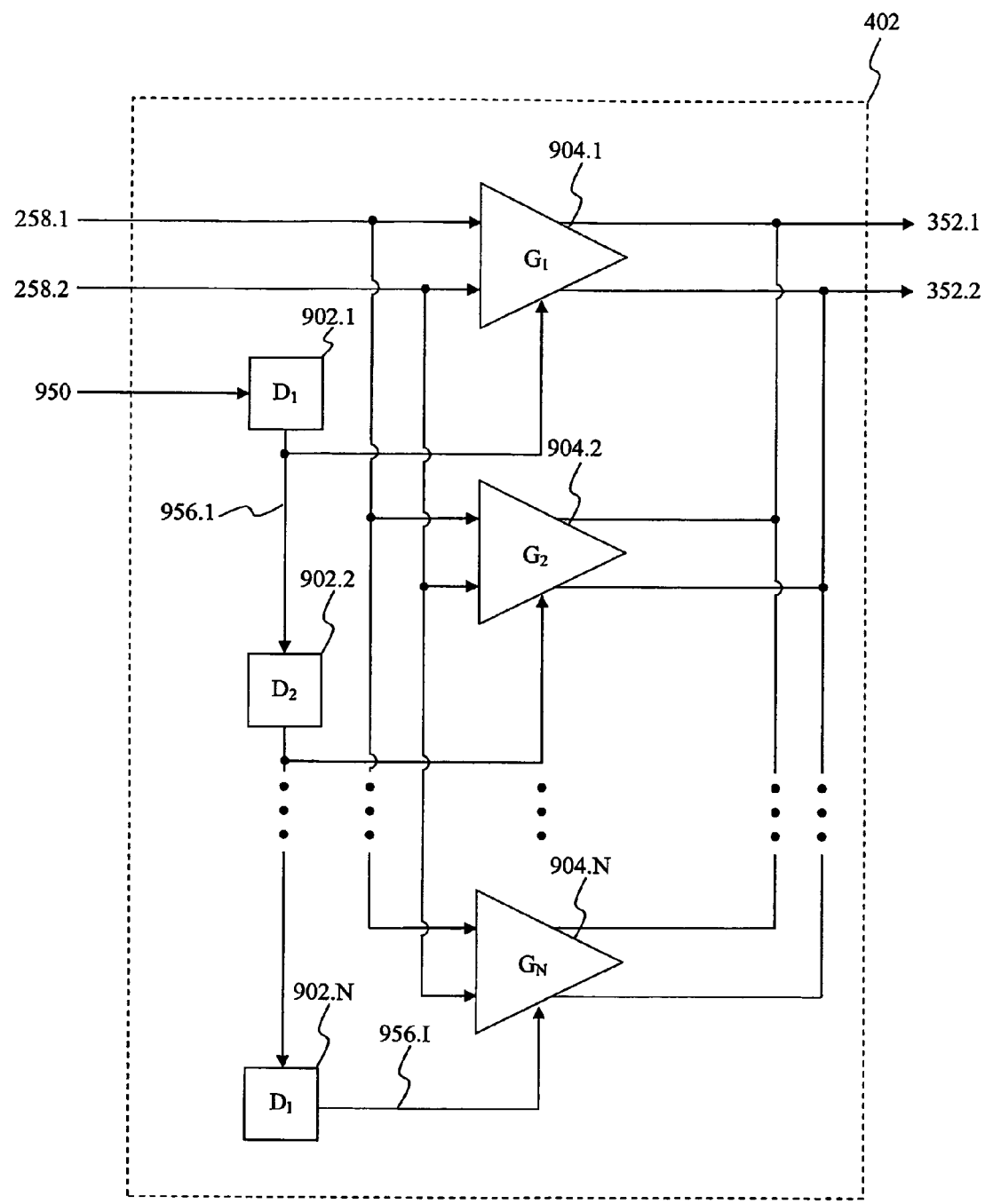
FIG. 9 illustrates a third block diagram of the transmission amplifier used in the amplifier module according to a third exemplary embodiment of the present invention.

FIG. 9 illustrates a third block diagram of the transmission amplifier used in the amplifier module according to a third exemplary embodiment of the present invention. The transmission amplifier 402 includes delay modules 902.1 through 902.N and amplifier modules 904.1 through 904.N. The delay modules 902.1 through 902.N delay an amplifier control 950 by a corresponding delay $D_1$ through $D_N$ to provide a corresponding delayed amplifier control 956.1 through 956.I. For example, the delay module 902.1 delays the amplifier control 950 by the delay $D_1$ to provide the delayed amplifier control 956.1. Likewise, the delay module 902.1 delays the delayed amplifier control 956.1 by the delay $D_2$ to provide the delayed amplifier control 956.2. In an exemplary embodiment, the amplifier control 950 represents an amplifier power down signal that when received by a corresponding one of the amplifier modules 904.1 through 904.N causes the corresponding one of the amplifier modules 904.1 through 904.N not to contribute to the first bidirectional communications signal 352.1 and the second bidirectional communications signal 352.2, respectively. In an exemplary embodiment, the delay modules 902.1 through 902.N substantially reduce turn-on and/or turn off transients by sequentially powering down and/or powering up the amplifier modules 904.1 through 904.N.

The amplifier modules 904.1 through 904.N may contribute to the first bidirectional communications signal 352.1 and the second bidirectional communications signal 352.2, respectively, in the transmit mode of operation. More specifically, the amplifier modules 904.1 through 904.N each receive the first amplifier bias via the contribute to the first bidirectional communications signal 352.1 and the second bidirectional communications signal 352.2, respectively and/or a corresponding one of the delayed amplifier controls 956.1 through 956.I in the transmit mode of operation. Each of the amplifier modules 904.1 through 904.N contribute to the first bidirectional communications signal 352.1 and the second bidirectional communications signal 352.2 upon receiving a corresponding one of the delayed amplifier controls 956.1 through 956.I that indicates the corresponding one of the amplifier modules 904.1 through 904.N is to contribute to the first bidirectional communications signal 352.1 and the second bidirectional communications signal 352.2 and/or upon receiving the first amplifier bias.

The amplifier modules 904.1 through 904.N do not contribute to the first bidirectional communications signal 352.1 and the second bidirectional communications signal 352.2 in the receive mode of operation. More specifically, the amplifier modules 904.1 through 904.N each receive the second amplifier bias via the first bidirectional communications signal 352.1 and the second bidirectional communications signal 352.2 and/or a corresponding one of the delayed amplifier controls 956.1 through 956.I in the receive mode of operation. Each of the amplifier modules 904.1 through 904.N does not contribute to the first bidirectional communications signal 352.1 and the second bidirectional communications signal 352.2 upon receiving a corresponding one of the delayed amplifier controls 956.1 through 956.I that indicates the corresponding one of the amplifier modules 904.1 through 904.N is not to contribute to the first bidirectional communications signal 352.1 and the second bidirectional communications signal 352.2 and/or upon receiving the second amplifier bias.

Biasing Module

Figure 10A:
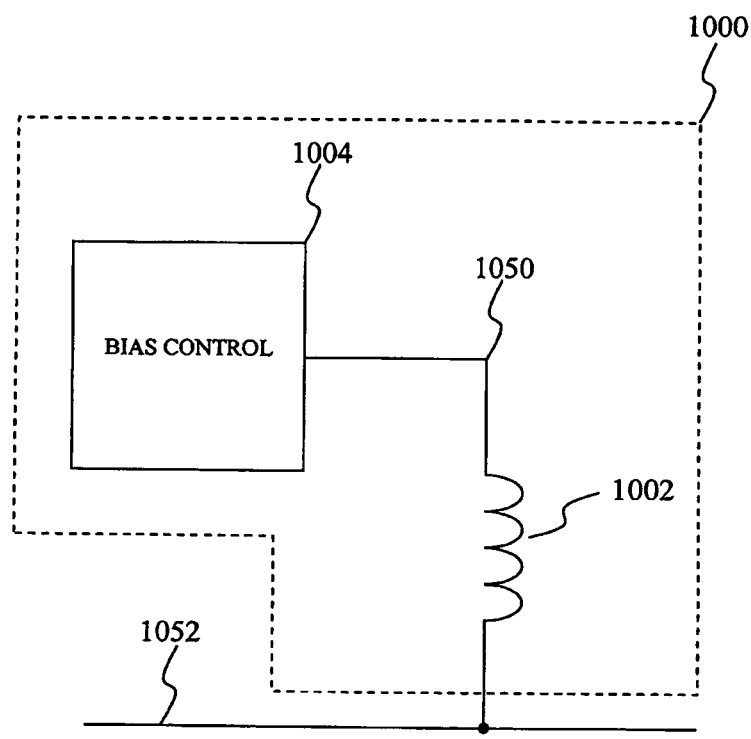
FIG. 10A illustrates a first block diagram of a biasing module used in the communications transceiver according to a first exemplary embodiment of the present invention.

FIG. 10A illustrates a first block diagram of a biasing module used in the communications transceiver according to a first exemplary embodiment of the present invention. A biasing module 1000 provides the first amplifier bias in the transmit mode of operation and/or the second amplifier bias in the receive mode of operation. The biasing module 1000 may represent an exemplary embodiment of the first biasing module 306.1 and/or the second biasing module 306.2.

The biasing module 1000 includes an inductor 1002 and a bias control module 1004. The bias control module 1004 provides a biasing power 1050, such as the first amplifier bias or the second amplifier bias to provide some examples. In an exemplary embodiment, the bias control module 1004 may additionally provide the biasing power 1050 to the matching impedance 304.1 via the first reference voltage and/or current 354.1 and/or the matching impedance 304.2 via the second reference voltage and/or current 354.2. The biasing power 1050 may include a first voltage and/or current corresponding to the first amplifier bias and/or a second voltage and/or current corresponding to the second amplifier bias. The biasing power 1050 provides the first voltage and/or current in the transmit mode of operation and/or the second voltage and/or current in the receive mode of operation. The inductor 1002 provides the biasing power 1050 to a bidirectional communications signal 1052, such as the first bidirectional communications signal 352.1 or the second bidirectional communications signal 352.2 to provide some examples. More specifically, the inductor 1002 couples the biasing power 1050 onto the bidirectional communications signal 1052.

Figure 10B:
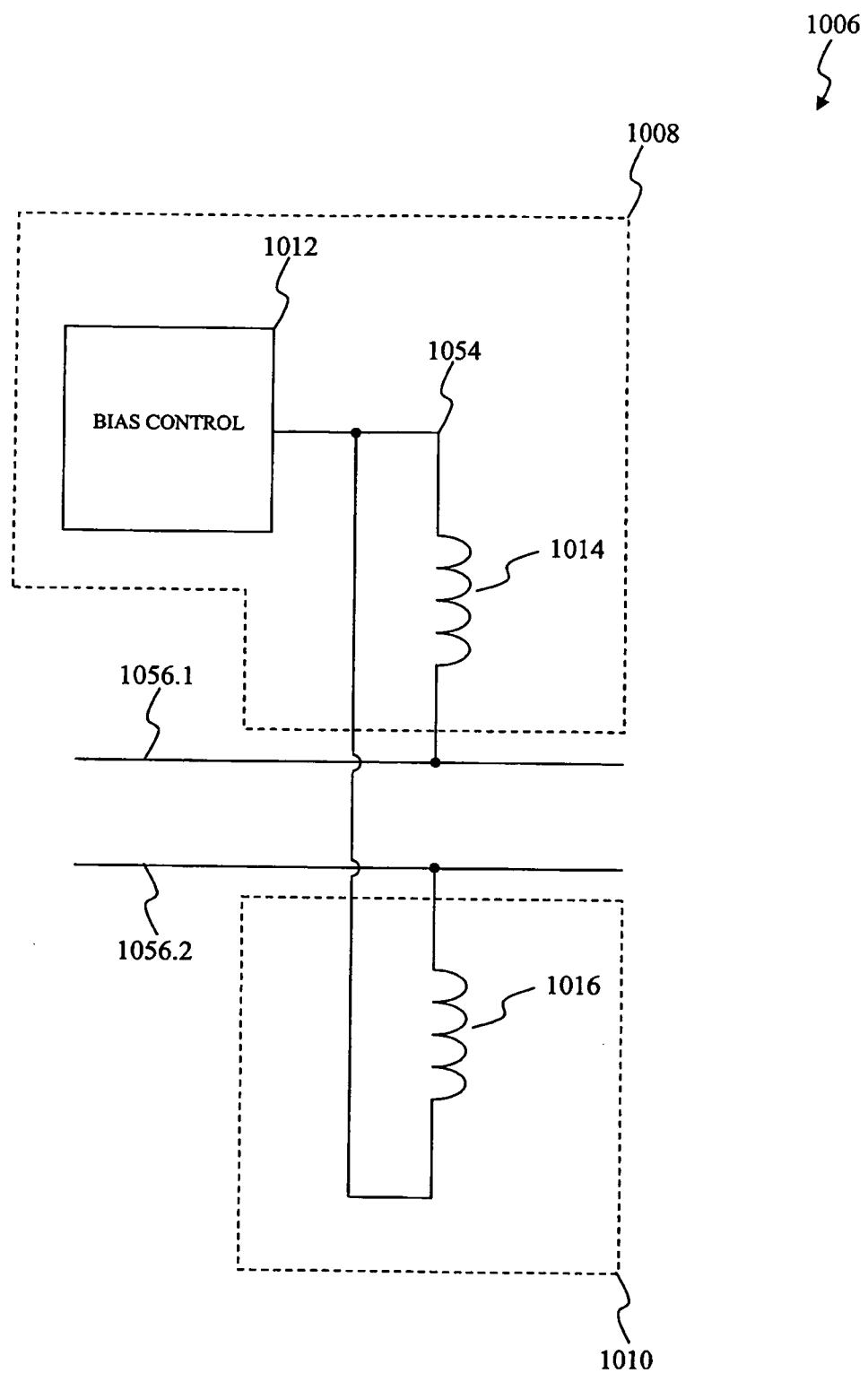
FIG. 10B illustrates a second block diagram of the biasing module used in the communications transceiver according to a second exemplary embodiment of the present invention.

FIG. 10B illustrates a second block diagram of the biasing module used in the communications transceiver according to a second exemplary embodiment of the present invention. A biasing module 1006 provides the first amplifier bias in the transmit mode of operation and/or the second amplifier bias in the receive mode of operation. The biasing module 1006 includes a first biasing module 1008 and a second biasing module 1010. The first biasing module 1008 may represent an exemplary embodiment of the first biasing module 306.1 and the second biasing module 1010 may represent an exemplary embodiment of the second biasing module 306.2. Alternatively, the first biasing module 1008 may represent an exemplary embodiment of the second biasing module 306.2 and the second biasing module 1010 may represent an exemplary embodiment of the first biasing module 306.1.

The first biasing module 1008 includes a bias control module 1012 and an inductor 1014. The bias control module 1012 provides a biasing power 1054, such as the first amplifier bias or the second amplifier bias to provide some examples. In an exemplary embodiment, the bias control module 1012 may additionally provide the biasing power 1054 to the matching impedance 304.1 via the first reference voltage and/or current 354.1 and/or the matching impedance 304.2 via the second reference voltage and/or current 354.2. The biasing power 1054 may include a first voltage and/or current corresponding to the first amplifier bias and/or a second voltage and/or current corresponding to the second amplifier bias. The biasing power 1054 provides the first voltage and/or current in the transmit mode of operation and/or the second voltage and/or current in the receive mode of operation. The inductor 1014 provides the biasing power 1054 to a first bidirectional communications signal 1056.1, such as the first bidirectional communications signal 352.1 or the second bidirectional communications signal 352.2 to provide some examples. More specifically, the inductor 1014 couples the biasing power 1054 onto the first bidirectional communications signal 1056.1.

The second biasing module 1010 includes an inductor 1016. The inductor 1016 provides the biasing power 1054 to a second bidirectional communications signal 1056.2, such as the first bidirectional communications signal 352.1 or the second bidirectional communications signal 352.2 to provide some examples. More specifically, the inductor 1014 couples the biasing power 1054 onto the second bidirectional communications signal 1056.2.

Figure 10C:
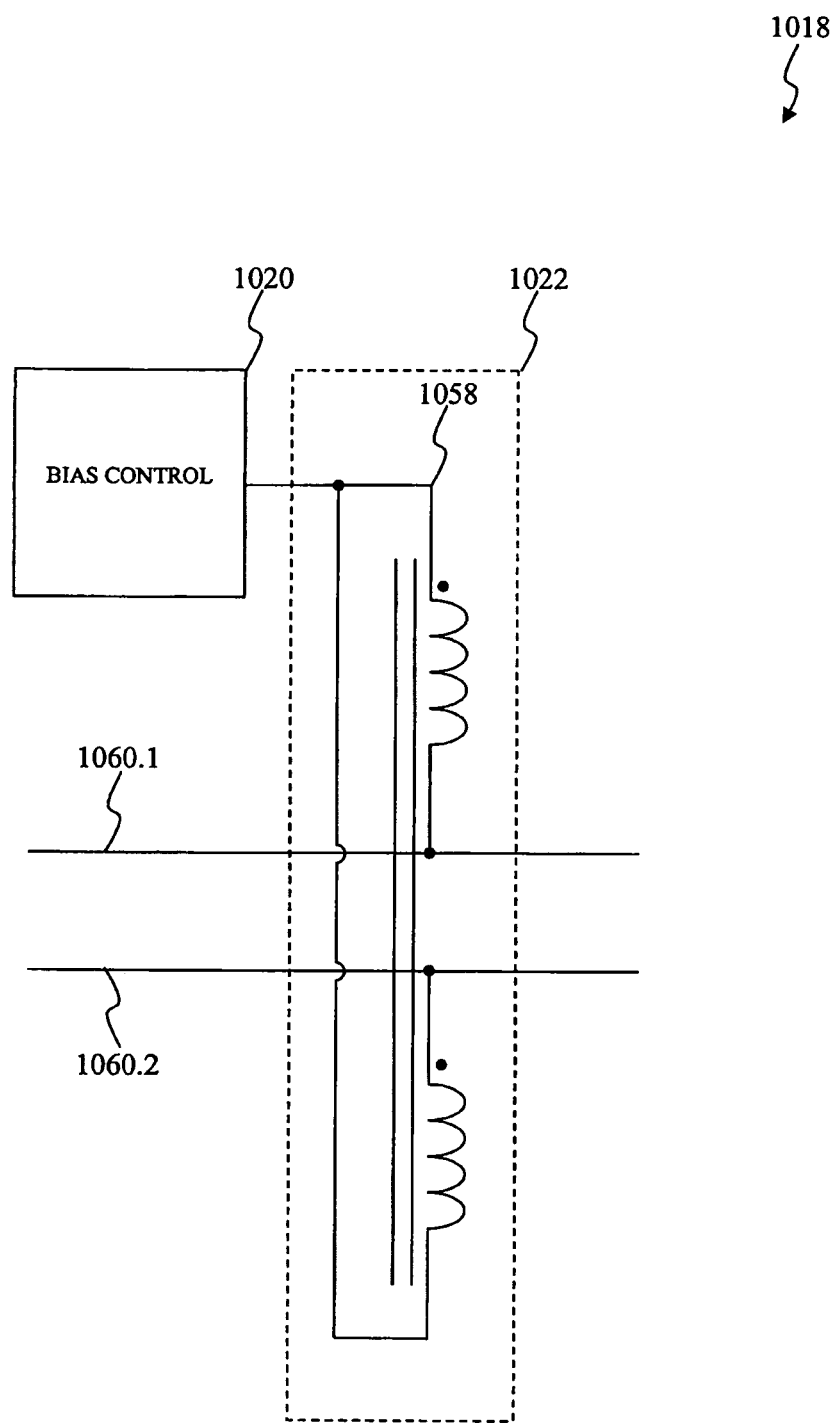
FIG. 10C illustrates a third block diagram of the biasing module used in the communications transceiver according to a third exemplary embodiment of the present invention.

FIG. 10C illustrates a third block diagram of the biasing module used in the communications transceiver according to a third exemplary embodiment of the present invention. A biasing module 1018 provides the first amplifier bias in the transmit mode of operation and/or the second amplifier bias in the receive mode of operation. The biasing module 1018 may represent an exemplary embodiment of a combination of the first biasing module 306.1 and the second biasing module 306.2.

The biasing module 1018 includes a bias control module 1020 and a tapped-inductor 1022. The first biasing module 1008 includes a bias control module 1018 and an inductor 1014. The bias control module 1018 provides a biasing power 1058, such as the first amplifier bias or the second amplifier bias to provide some examples. In an exemplary embodiment, the bias control module 1018 may additionally provide the biasing power 1058 to the matching impedance 304.1 via the first reference voltage and/or current 354.1 and/or the matching impedance 304.2 via the second reference voltage and/or current 354.2. The biasing power 1058 may include a first voltage and/or current corresponding to the first amplifier bias and/or a second voltage and/or current corresponding to the second amplifier bias. The biasing power 1058 provides the first voltage and/or current in the transmit mode of operation and/or the second voltage and/or current in the receive mode of operation.

The tapped-inductor 1022 includes a first tap and a second tap. The first tap of the tapped-inductor 1022 provides the biasing power 1058 to a first bidirectional communications signal 1056.1, such as the first bidirectional communications signal 352.1 or the second bidirectional communications signal 352.2 to provide some examples. More specifically, the first tap of the tapped-inductor 1022 couples the biasing power 1058 onto the first bidirectional communications signal 1056.1. Likewise, the second tap of the tapped-inductor 1022 provides the biasing power 1058 to a second bidirectional communications signal 1056.2, such as the first bidirectional communications signal 352.1 or the second bidirectional communications signal 352.2 to provide some examples. More specifically, the first tap of the tapped-inductor 1022 couples the biasing power 1058 onto the second bidirectional communications signal 1056.2.

Figure 11:
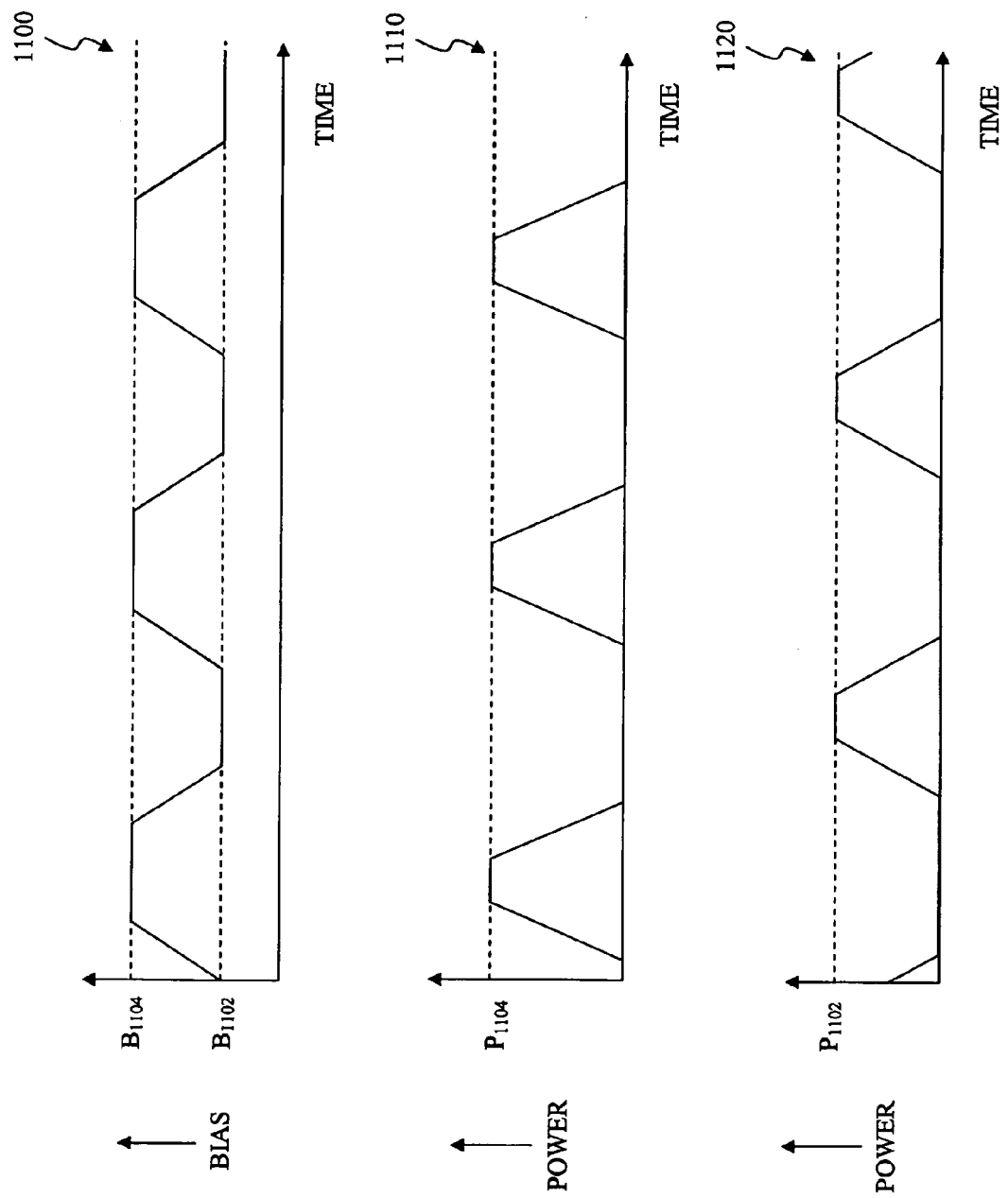
FIG. 11 illustrates an operation of the biasing module used in the communications transceiver according to an exemplary embodiment of the present invention.

FIG. 11 illustrates an operation of the biasing module used in the communications transceiver according to an exemplary embodiment of the present invention. However, this example is not limiting, the operation of the biasing module as demonstrated in FIG. 11 is for illustrative purposes only. Those skilled in the relevant art(s) may operate the biasing module differently in accordance with the teachings herein without departing from the spirit and scope of the present invention.

The biasing module, such as the first biasing module 306.1 or the second biasing module 306.2 to provide some examples, may operate in the transmit mode of operation or the receive mode of operation. As illustrated by a graphical representation 1100, the biasing module provides the first amplifier bias, denoted as $B_{1104}$, in the transmit mode of operation. Likewise, the biasing module provides the second amplifier bias, denoted as $B_{1102}$, in the receive mode of operation.

An amplifier module, such as the amplifier module 302 to provide an example, may include a transmission amplifier, such as the transmission amplifier 402 to provide an example, and/or a reception amplifier, such as the reception amplifier 404 to provide an example. As illustrated by a graphical representation 1110, the first amplifier bias causes the transmission amplifier to provide a transmission power $P_{1104}$, such as the first bidirectional communications signal 352.1 and/or the second bidirectional communications signal 352.2 to provide some examples, in the transmit mode of operation. The second amplifier bias causes the transmission amplifier not to provide a reception power $P_{1102}$, such as the first amplified received communications signal 260.1 and/or the second amplified received communications signal 260.2 to provide some examples, in the transmit mode of operation. As illustrated by a graphical representation 1120, the second amplifier bias causes the reception amplifier to provide the reception power $P_{1102}$ in the receive mode of operation. The second amplifier bias causes the transmission amplifier not to provide the transmission power $P_{1104}$ in the receive mode of operation.

Balun Module

Figure 12:
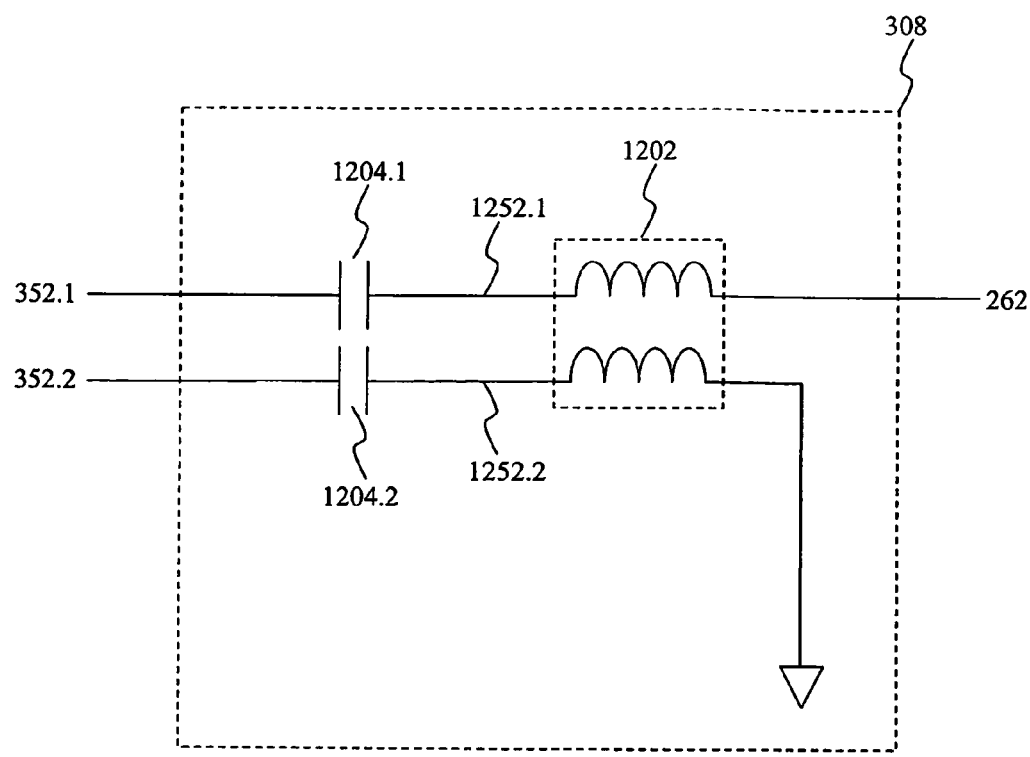
FIG. 12 illustrates a block diagram of a balun module used in the communications transceiver according to an exemplary embodiment of the present invention.

FIG. 12 illustrates a block diagram of a balun module used in the communications transceiver according to an exemplary embodiment of the present invention. The balun module 308 converts a single ended communications signal, such as the bidirectional communications signal 262 to provide an example, to a differential communications signal, such as the first bidirectional communications signal 352.1 and the second bidirectional communications signal 352.2 to provide an example. The balun module 308 may also convert the differential communications signal to the single ended communications signal.

The balun module 308 includes a transmission line balun 1202 and capacitors 1204.1 and 1204.2. The transmission line balun 1202 converts the bidirectional communications signal 262 to a differential communications signal 1252. For example, the transmission line balun 1202 converts the bidirectional communications signal 262 to a first differential communications signal 1252.1 and a second differential communications signal 1252.2.

The first bidirectional communications signal 352.1 and/or the second bidirectional communications signal 352.2 may include one or more low frequency components, such as the first amplifier bias and/or the second amplifier bias to provide some examples, and/or one or more high frequency components. The capacitors 1204.1 and 1204.2 prevent the one or more low frequency components from being provided to the first differential communications signal 1252.1 and/or the second differential communications signal 1252.2. However, the capacitors 1204.1 and 1204.2 provide one or more high frequency components of the first bidirectional communications signal 352.1 and/or the second bidirectional communications signal 352.2 to the first communications signal 1252.1 and/or the second differential communications signal 1252.2. Similarly, the first differential communications signal 1252.1 and/or the second differential communications signal 1252.2 may include one or more high frequency components. The capacitors 1204.1 and 1204.2 provide the one or more high frequency components to the first bidirectional communications signal 352.1 and/or the second bidirectional communications signal 352.2.

Combined Biasing and Balun Module

Figure 13:
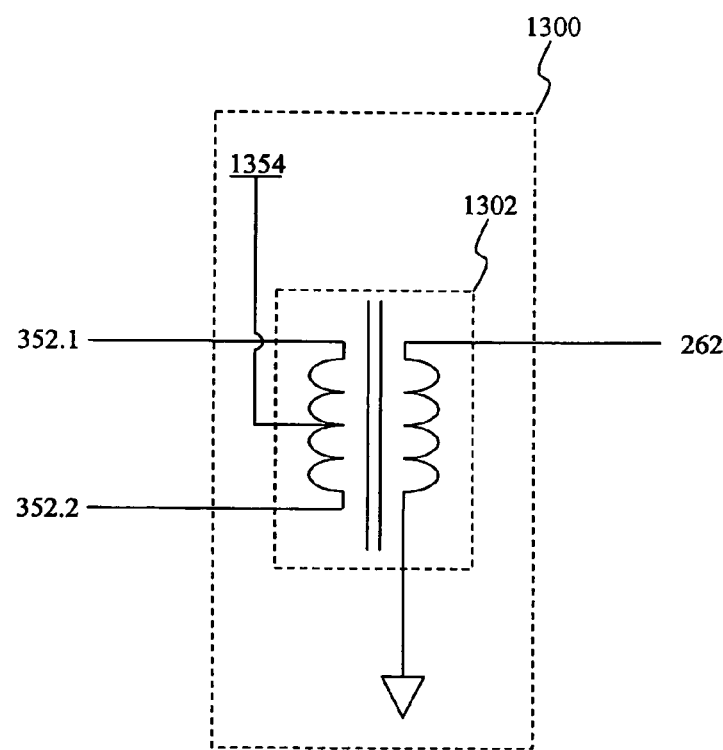
FIG. 13 illustrates a block diagram of a combined biasing and balun module used in the communications transceiver according to an exemplary embodiment of the present invention.

FIG. 13 illustrates a block diagram of a combined biasing and balun module used in the communications transceiver according to an exemplary embodiment of the present invention. A combined biasing and balun module 1300 combines a functionality of a biasing module, such as the first biasing module 306.1 and/or the second biasing module 306.2 to provide some examples, with a functionality of a balun module, such as the balun module 308 to provide an example. The combined biasing and balun module 1300 provides the first amplifier bias in the transmit mode of operation and/or the second amplifier bias in the receive mode of operation. The combined biasing and balun module 1300 may additionally convert a single ended communications signal, such as the bidirectional communications signal 262 to provide an example, to a differential communications signal, such as the first bidirectional communications signal 352.1 and/or the second bidirectional communications signal 352.2 to provide an example. The combined biasing and balun module 1300 may also convert the differential communications signal to the single ended communications signal.

The combined biasing and balun module 1300 includes a flux coupled balun 1302. The flux coupled balun 1302 provides a biasing power 1354, such as the first amplifier bias or the second amplifier bias to provide some examples, to the first bidirectional communications signal 352.1 and/ the second bidirectional communications signal 352.2. The biasing power 1354 may include a first voltage and/or current corresponding to the first amplifier bias and/or a second voltage and/or current corresponding to the second amplifier bias. The biasing power 1354 provides the first voltage and/or current in the transmit mode of operation and/or the second voltage and/or current in the receive mode of operation.

The flux coupled balun 1302 additionally coverts the single ended communications signal to a differential communications signal. More specifically, the flux coupled balun 1302 separates the bidirectional communications signal 262 to provide the first bidirectional communications signal 352.1 and the second bidirectional communications signal 352.2. Likewise, the flux coupled balun 1302 coverts the first bidirectional communications signal 352.1 and the second bidirectional communications signal 352.2 to the bidirectional communications signal 262.

Combined Amplifier and Biasing Module

Figure 14:
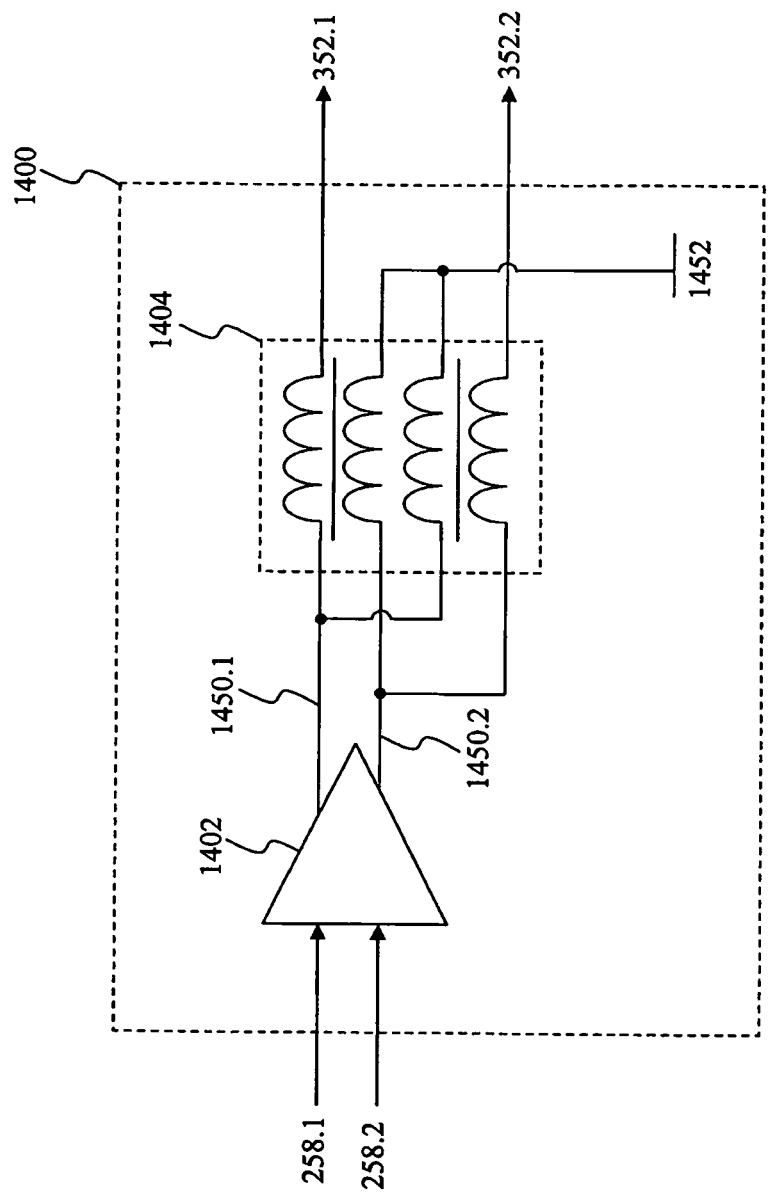
FIG. 14 illustrates a block diagram of a combined amplifier and biasing module used in the communications transceiver according to an exemplary embodiment of the present invention.

FIG. 14 illustrates a block diagram of a combined amplifier and biasing module used in the communications transceiver according to an exemplary embodiment of the present invention. A combined amplifier and biasing module 1400 combines a functionality of a transmission amplifier module, such as the transmission amplifier 402 to provide an example, with a functionality of a biasing module, such as the first biasing module 306.1 and/or the second biasing module 306.2 to provide an example. In the transmit mode of operation, the combined amplifier and biasing module 1400 amplifies the first unamplified transmitted communications signal 258.1 and the second unamplified transmitted communications signal 258.2 to provide the first bidirectional communications signal 352.1 and the second bidirectional communications signal 352.2, respectively. The combined amplifier and biasing module 1400 provides the first amplifier bias in the transmit mode of operation and/or the second amplifier bias in the receive mode of operation.

The combined amplifier and biasing module 1400 includes an amplifier module 1402 and a step-up transmission line transformer 1404. In the transmit mode of operation, the amplifier module 1402 amplifies the first unamplified transmitted communications signal 258.1 and the second unamplified transmitted communications signal 258.2 to provide a first intermediate amplified transmitted communications signal 1450.1 and a second intermediate amplified transmitted communications signal 1450.2, respectively. More specifically, the transmission amplifier 402 receives the first amplifier bias via the first intermediate amplified transmitted communications signal 1450.1 and the second intermediate amplified transmitted communications signal 1450.2. The first amplifier bias causes the amplifier module 1402 to enter into an active state. The amplifier module 1402 amplifies the first unamplified transmitted communications signal 258.1 and the second unamplified transmitted communications signal 258.2 to provide the first intermediate amplified transmitted communications signal 1450.1 and the second intermediate amplified transmitted communications signal 1450.2, respectively while in the active state.

In the receive mode of operation, the amplifier module 1402 does not provide the first intermediate amplified transmitted communications signal 1450.1 and the second intermediate amplified transmitted communications signal 1450.2. More specifically, the transmission amplifier 402 receives the second amplifier bias via the first intermediate amplified transmitted communications signal 1450.1 and the second intermediate amplified transmitted communications signal 1450.2. The second amplifier bias causes the amplifier module 1402 to enter into an inactive state. The amplifier module 1402 does not amplify the first unamplified transmitted communications signal 258.1 and the second unamplified transmitted communications signal 258.2 while in the inactive state.

The step-up transmission line transformer 1404 may provide the first bidirectional communications signal 352.1 and the second bidirectional communications signal 352.2 based upon the first intermediate amplified transmitted communications signal 1450.1 and the second intermediate amplified transmitted communications signal 1450.2. More specifically, the step-up transmission line transformer 1404 increases a voltage of the first intermediate amplified transmitted communications signal 1450.1 and the second intermediate amplified transmitted communications signal 1450.2 to provide the first bidirectional communications signal 352.1 and the second bidirectional communications signal 352.2, respectively. The step-up transmission line transformer 1404 may provide the first amplifier bias and/or the second amplifier bias to the amplifier module 1402 via an amplifier bias 1452. The step-up transmission line transformer 1404 may receive an amplifier biasing power 1452, such as the first amplifier bias or the second amplifier bias to provide some examples. The amplifier biasing voltage 1452 may include a first voltage and/or current corresponding to the first amplifier bias and/or a second voltage and/or current corresponding to the second amplifier bias. The amplifier biasing voltage 1452 provides the first voltage and/or current in the transmit mode of operation and/or the second voltage and/or current in the receive mode of operation.

CONCLUSION

It is to be appreciated that the Detailed Description section, and not the Abstract section, is intended to be used to interpret the claims. The Abstract section may set forth one or more, but not all exemplary embodiments, of the present invention, and thus, are not intended to limit the present invention and the appended claims in any way.

The present invention has been described above with the aid of functional building blocks illustrating the implementation of specified functions and relationships thereof. The boundaries of these functional building blocks have been arbitrarily defined herein for the convenience of the description. Alternate boundaries may be defined so long as the specified functions and relationships thereof are appropriately performed.

It will be apparent to those skilled in the relevant art(s) that various changes in form and detail can be made therein without departing from the spirit and scope of the invention. Thus the present invention should not be limited by any of the above-described exemplary embodiments, but should be defined only in accordance with the following claims and their equivalents.

What is claimed is:

1. A communications front end, configured to transmit a transmitted component of a bidirectional communications signal over a shared medium, and to receive a received component of the bidirectional communications signal from the shared medium, comprising:

a transmission amplifier configured to provide the transmitted component of the bidirectional communications signal in a transmit mode of operation;

a reception amplifier, having an input coupled to an output of the transmission amplifier to form a common connection, configured to provide the received component of the bidirectional communications signal in a receive mode of operation; and one or more bias networks configured to provide a first amplifier bias to the common connection and a transmission bias to an input of the transmission amplifier during the transmit mode of operation or a second amplifier bias that is less than the first amplifier bias to the common connection and a reception bias to an output of the reception amplifier during the receive mode of operation and to cause the transmission amplifier to operate in the transmit mode of operation when the transmission bias is less than the first amplifier bias and the reception amplifier to operate in the reception mode of operation when the reception bias is greater than the second amplifier bias, wherein the transmission amplifier comprises:
a first stage configured to receive the transmission bias at its respective input and a first constant current bias at its respective output; and
a second stage configured to receive the first constant current bias at its respective input and at least one of the first amplifier bias and the second amplifier bias at its respective output;
wherein, the transmission bias is less than the first constant current bias and the first constant current bias is less than the first amplifier bias during transmission, and
wherein the reception amplifier comprises:
a third stage configured to receive at least one of the first amplifier bias and the second amplifier bias at its respective output and a second constant current bias that is greater than the first amplifier bias at its respective output, and
a fourth stage configured to receive the second constant current bias that is less than the reception bias at its respective input and the reception bias at its respective output,
wherein, the second amplifier bias is less than the second constant current bias and the second constant current bias is less than the reception bias during reception.

2. The communications front end of claim 1, wherein the transmission amplifier is further configured to not provide the transmitted component of the bidirectional communications signal in the receive mode of operation and the reception amplifier is further configured to not provide the received component of the bidirectional communications signal in the transmit mode of operation.

3. The communications front end of claim 1, further comprising:
one or more matching impedances coupled to the common connection, configured to substantially match a characteristic impedance of the shared medium.

4. The communications front end of claim 1, wherein the bidirectional communications signal represents a differential signal.

5. The communications front end of claim 4, further comprising:
a balun module, coupled to the common connection, configured to convert the bidirectional communications signal from a differential communications signal to a single ended communications signal.

6. The communications front end of claim 1, further comprising:
a capacitor, coupled between the common connection and the reception amplifier, configured to prevent the reception amplifier from receiving the first amplifier bias and the second amplifier bias.

7. The communications front end of claim 1, wherein the first stage of the transmission amplifier comprises:
a transistor configured to receive the transmission bias at its respective input and at least one of the first amplifier bias and the second amplifier bias at its respective output and to provide the transmitted component of the bidirectional communications signal via its respective output when the first amplifier bias is greater than the transmission bias.

8. The communications front end of claim 7, wherein the transistor is further configured to not provide the transmitted component of the bidirectional communications signal via its respective output when the transmission bias is greater than the second amplifier bias.

9. The communications front end of claim 1, wherein the fourth stage of the reception amplifier comprises:
a transistor configured to receive the reception bias at its respective output and at least one of the first amplifier bias and the second amplifier bias at its respective input and to provide the received component of the bidirectional communications signal via its respective output when the second amplifier bias is less than the reception bias.

10. The communications front end of claim 9, wherein the transistor is further configured to not provide the received component of the bidirectional communications signal via its respective output when the reception bias is greater than the first amplifier bias.

11. The communications front end of claim 1, wherein the one or more bias networks comprise:
a bias control module configured to provide at least one of the first amplifier bias in the transmit mode of operation and the second amplifier bias in the receive mode of operation; and
an inductor coupled to the bias control module configured to provide the at least one of the first amplifier bias and the second amplifier bias to the common connection.

12. A communications front end, configured to transmit a transmitted component of a bidirectional communications signal, and to receive a received component of the bidirectional communications signal from a shared medium, comprising:
a transmission amplifier configured to provide the transmitted component of the bidirectional communications signal to a common connection; and
a reception amplifier, coupled to the transmission amplifier, configured to receive the received component of the bidirectional communications signal from the common connection,
wherein the transmission amplifier is further configured to provide the transmitted component of the bidirectional communications signal upon receipt of a first amplifier bias from the common connection and a transmission bias at an input of the transmission amplifier to cause the transmission amplifier to operate in the transmit mode of operation when the transmission bias is less than the first amplifier bias, and
wherein the reception amplifier is further configured to provide the received component of the bidirectional communications signal upon receipt of a second amplifier bias from the common connection and upon receipt of a reception bias at an output of the reception amplifier to operate in the reception mode of operation when the reception bias is greater than the second amplifier bias, and
wherein the transmission amplifier comprises:
a first stage configured to receive the transmission bias at its respective input and a first constant current bias at its respective output; and
a second stage configured to receive the first constant current bias at its respective input and at least one of the first amplifier bias and the second amplifier bias at its respective output;
wherein, the transmission bias is less than the first constant current bias and the first constant current bias is less than the first amplifier bias during transmission, and wherein the reception amplifier comprises:
- a third stage configured to receive at least one of the first amplifier bias and the second amplifier bias at its respective output and a second constant current bias that is greater than the first amplifier bias at its respective output, and
- a fourth stage configured to receive the second constant current bias that is less than the reception bias at its respective input and the reception bias at its respective output,
- wherein, the second amplifier bias is less than the second constant current bias and the second constant current bias is less than the reception bias during reception.

13. The communications front end of claim 12, wherein the transmission amplifier is further configured to not provide the transmitted component of the bidirectional communications signal upon receipt of the second amplifier bias and the reception amplifier is further configured to not provide the received component of the bidirectional communications signal upon receipt of the first amplifier bias.

14. The communications front end of claim 12, further comprising:
- one or more matching impedances coupled to the common connection to substantially match a characteristic impedance of the shared medium.

15. The communications front end of claim 12, wherein the bidirectional communications signal represents a differential signal.

16. The communications front end of claim 15, further comprising:
- a balun module, coupled to the common connection, configured to convert the bidirectional communications signal from a differential communications signal to a single ended communications signal.

17. The communications front end of claim 12, further comprising:
- a capacitor coupled between the common connection and the reception amplifier, configured to prevent the reception amplifier from receiving the first amplifier bias and the second amplifier bias.

18. The communications front end of claim 12, wherein the first stage of the transmission amplifier comprises:
- a transistor configured to receive the transmission bias at its respective input and at least one of the first amplifier bias and the second amplifier bias at its respective output, and to provide the transmitted component of the bidirectional communications signal via its respective output when the first amplifier bias is greater than the transmission bias.

19. The communications front end of claim 18, wherein the transistor is further configured to not provide the transmitted component of the bidirectional communications signal via its respective output when the transmission bias is greater than the first amplifier bias.

20. The communications front end of claim 12, wherein the fourth stage of the reception amplifier comprises:
- a transistor configured to receive the reception bias at its respective output and at least one of the first amplifier bias and the second amplifier bias at its respective input and to provide the received component of the bidirectional communications signal via its respective output when the second amplifier bias is less than the reception bias.

21. The communications front end of claim 20, wherein the transistor is further configured to not provide the received component of the bidirectional communications signal via its respective output when the reception bias is less than the second amplifier bias.

22. The communications front end of claim 12, further comprising:
- one or more bias networks configured to provide the first amplifier bias to the common connection via the bidirectional communications signal or the second amplifier bias to the transmission amplifier and the reception amplifier via the bidirectional communications signal.

23. The communications front end of claim 22, wherein the one or more bias networks comprise:
- a bias control module configured to provide at least one of the first amplifier bias in the transmit mode of operation and the second amplifier bias in the receive mode of operation; and
- an inductor coupled to the bias control module configured to provide the at least one of the first amplifier bias and the second amplifier bias to the common connection.

24. A communications front end comprising:
- a transmission amplifier configured to provide a transmitted component of a bidirectional communications signal in a transmit mode of operation;
- a reception amplifier configured to provide a received component of the bidirectional communications signal in a receive mode of operation; and
- one or more bias networks configured to:
  - provide a first amplifier bias to a common connection between the transmission amplifier and the reception amplifier, a transmission bias to an input of the transmission amplifier during the transmit mode of operation or a second amplifier bias that is less than the first amplifier bias to the common connection, and a reception bias to an output of the reception amplifier during the receive mode of operation, and
  - cause the transmission amplifier to operate in the transmit mode of operation when the transmission bias is less than the first amplifier bias and the reception amplifier to operate in the reception mode of operation when the reception bias is greater than the second amplifier bias,
- wherein the transmission amplifier comprises:
  - a first stage configured to receive the transmission bias at its respective input and a first constant current bias at its respective output; and
  - a second stage configured to receive the first constant current bias at its respective input and at least one of the first amplifier bias and the second amplifier bias at its respective output;
  - wherein, the transmission bias is less than the first constant current bias and the first constant current bias is less than the first amplifier bias during transmission, and
- wherein the reception amplifier comprises:
  - a third stage configured to receive at least one of the first amplifier bias and the second amplifier bias at its respective output and a second constant current bias that is greater than the first amplifier bias at its respective output, and
  - a fourth stage configured to receive the second constant current bias that is less than the reception bias at its respective input and the reception bias at its respective output,
  - wherein, the second amplifier bias is less than the second constant current bias and the second constant current bias is less than the reception bias during reception.

* * * * *

UNITED STATES PATENT AND TRADEMARK OFFICE
CERTIFICATE OF CORRECTION

PATENT NO. : 9,614,575 B2
APPLICATION NO. : 12/385915
DATED : April 4, 2017
INVENTOR(S) : Gomez et al.

Page 1 of 1

It is certified that error appears in the above-identified patent and that said Letters Patent is hereby corrected as shown below:

In Column 28, Line 19, replace "end comprising" with --end, comprising--.

Signed and Sealed this
Tenth Day of July, 2018

Andrei Iancu
*Director of the United States Patent and Trademark Office*